United States Patent
Elzinga et al.

(10) Patent No.: US 10,944,411 B1
(45) Date of Patent: Mar. 9, 2021

(54) PLL CAPACITOR SWAP TECHNIQUE AND LOW JITTER DYNAMIC DIGITAL CONTROLLED OSCILLATOR BAND SELECT

(71) Applicant: Intel Corporation, Santa Clara, CA (US)

(72) Inventors: Mark Elzinga, Shingle Springs, CA (US); Youngmin Park, Folsom, CA (US); Michael Bichan, Toronto (CA); Michael W. Altmann, Folsom, CA (US); Noam Familia, Modiin (IL); Vadim Levin, Mevaseret Zion (IL); Dror Lazar, Kiryat Bialik (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,601

(22) Filed: Dec. 27, 2019

(51) Int. Cl.
*H03L 7/10* (2006.01)
*H03M 3/00* (2006.01)
*H03L 7/099* (2006.01)
*H03L 7/18* (2006.01)
*H03L 7/187* (2006.01)

(52) U.S. Cl.
CPC .............. *H03L 7/10* (2013.01); *H03L 7/0991* (2013.01); *H03L 7/18* (2013.01); *H03L 7/187* (2013.01); *H03M 3/50* (2013.01)

(58) Field of Classification Search
CPC ......... H03L 7/1976; H03L 7/081; H03L 7/10; H03L 7/0991; H03L 7/18; H03L 7/187; H03B 19/14; H03B 5/04; H03B 5/1215; H03B 5/1228; H03B 5/1243; H03B 5/1265; H03B 5/30; H03B 5/36; H03B 5/364; H03M 3/50
USPC ... 331/16, 34, 167, 177 V, 117 FE, 1 A, 179
See application file for complete search history.

(56) References Cited

U.S. PATENT DOCUMENTS

| 8,779,867 B2 * | 7/2014 | Thaller ................ H03B 5/1265 331/177 V |
| 2017/0359052 A1 * | 12/2017 | Luong .................... H03H 7/004 |

* cited by examiner

*Primary Examiner* — Arnold M Kinkead
(74) *Attorney, Agent, or Firm* — Green, Howard & Mughal LLP

(57) ABSTRACT

Described is an apparatus comprising a first circuitry, a second circuitry, a first capacitor array, and a second capacitor array. The first circuitry may have an oscillator. The first capacitor array may have a set of first capacitors to tune the oscillator. The second capacitor array may have a second capacitor to tune the oscillator. A capacitance of the second capacitor may be greater than an average capacitance of the first capacitors. The second circuitry may be operable to synchronously activate the second capacitor and deactivate a number N of the first capacitors, and to synchronously deactivate the second capacitor and activate the N first capacitors, based on a predetermined sequence.

20 Claims, 10 Drawing Sheets

US 10,944,411 B1

PLL CAPACITOR SWAP TECHNIQUE AND LOW JITTER DYNAMIC DIGITAL CONTROLLED OSCILLATOR BAND SELECT

BACKGROUND

In many Phase Locked Loop (PLL) clocking circuitries, there is a tradeoff between dynamic temperature range and critical PLL performance metrics, such as frequency range and jitter. For example, various PLL clocking circuitries, including inductor-capacitor tank based PLL (LCPLL) clocking circuitries, and Delay Locked Loop (DLL) clocking circuitries, and other clocking circuits may have a target dynamic temperature range of more than 165 C, without compromising frequency range, and while maintaining similar if not better jitter performance.

Meanwhile, Digital Controlled Oscillators (DCOs) of various types (e.g., ring oscillators or inductor-capacitor (LC) tank based circuitries) may use a capacitor bank to fine-tune a frequency for phase locking. While the capacitor bank may be designed to provide high resolution of the frequency tuning, it may suffer from a poor $C_{ON}$ to $C_{OFF}$ ratio. In such cases, even when all of the capacitor bank is turned off, there may still be a significant parasitic capacitance that loads the oscillator. As parasitic capacitance increases, a DCO may be disposed to wasting more power and area to reach its target frequency. Moreover, if parasitic capacitance is too high, a DCO might not be able to reach frequency target at all.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
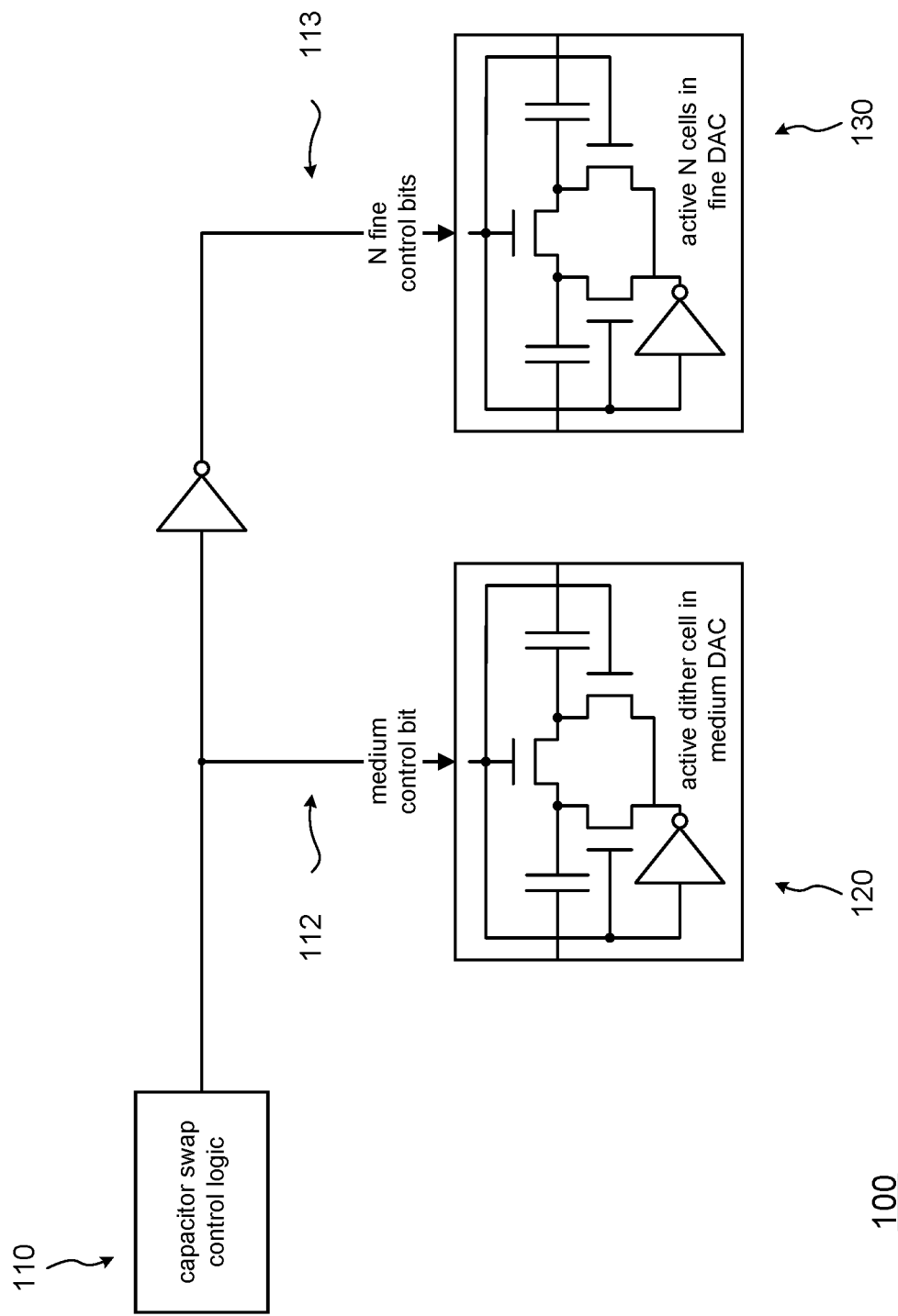
FIG. 1 illustrates a scenario of capacitor-swap control bits for oscillator circuitries, in accordance with some embodiments of the disclosure.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In various embodiments, Phase Locked Loop (PLL) clocking circuitries may be targeted to have a wide dynamic temperature range (e.g., more than 165 C) and a wide frequency range while maintaining similar if not better jitter performance. Some digital PLLs may enable swapping of "coarse" frequency tuning or control bits (e.g., of a "coarse" array, or an array of "coarse" tuning capacitors) with a number N of "fine" frequency tuning or control bits (e.g., of a "fine" array, or array of "fine" tuning capacitors), where N may be a ratio of the size of a coarse step to the size of a fine step (e.g., in capacitance). The coarse tuning may be calibrated, and the fine tuning may be controlled by the PLL (e.g., closed-loop).

However, such systems may have poor jitter performance, in part because they may be sensitive to a mismatch between a coarse bit and N fine bits. Moreover, such systems may also be disposed to calibrate the ratio N ahead of time, but temperature, voltage, and aging-induced drift effects may cause the appropriate ratio N to change over time. Accordingly, although the residual quantization may be a small period jitter, it can accumulate to a large phase jitter as time passes.

With respect to a variety of embodiments, disclosed herein are mechanisms and methods for facilitating high-performance clocking circuitry tuning. In some embodiments, an additional level of segmentation of frequency control bits, which may be referred to as "medium" frequency tuning or control bits (e.g., of a "medium" array, or array of "medium" tuning capacitors) may be added to coarse bits and fine bits of an oscillator, such as a PLL Digital Controlled Oscillator (DCO). The medium bits may be larger than the fine bits (e.g., may have a greater capacitance than the fine bits) by a ratio of some number N. The use of the medium bits as discussed herein may advantageously facilitate or enable a wider frequency range, due to an improved $C_{ON}$ to CUFF ratio for an associated tuning capacitance. In some embodiments, the use of a least-significant bit (LSB) of a set of coarse bits may have similar advantages.

For some embodiments, during a temperature ramp, a capacitor swap circuitry for the clocking circuitry (e.g., a delta-sigma capacitor swap (DSCS) circuitry) may activate one or more medium control bits merely as needed to avoid an overflow and/or underflow of the fine tuning control bits, based on one or more predetermined thresholds for fine-tuning frequency range margins. In some embodiments, a capacitor swap technique for swapping a number N of fine bits for a single medium bit (or, in some embodiments, a single coarse bit, such as an LSB coarse bit) may be used to achieve very low jitter as medium control bits are activated and/or de-activated. In various embodiments, the capacitor swap technique may apply a delta-sigma modulator and/or a background digital calibration for the ratio N. Some embodiments may incorporate registers (e.g., configuration registers) to set an initial value for the ratio N, and/or registers to set one or more threshold values (e.g., a low threshold and/or a high threshold) for the capacitance swap.

By applying a pulse (e.g., a sequence of activation indicators and deactivation indicators) to the medium bit, and a negative pulse (e.g., an inverted version of the sequence of activation indicators and deactivation indicators) to the corresponding N fine bits, the mechanisms and methods discussed herein may cancel out jitter that may be associated with a large frequency step (e.g., a frequency step from a larger-granulation frequency tuning or control bit, such as a medium bit or a coarse bit). Such mechanisms and methods may advantageously provide continuous, dynamic calibration to avoid errors that may be result from temperature, voltage, and/or aging-induced drift effects (which may change the appropriate ratio N over time).

Accordingly, application of the methods and mechanisms discussed herein may advantageously avoid trade-offs between wide dynamic temperature range, wide frequency range, and good jitter performance for various clocking circuitries (including LCPLLs). This may enable a smaller range in a fine capacitor array (or another fine-tuning component of a DCO or other oscillator), which may in turn advantageously facilitate a wider total frequency range, or a reduced limit cycle and quantization deterministic jitter (DJ) of a digital PLL (e.g., by utilizing smaller step sizes in a fine array, or both. The improved $C_{ON}$ to $C_{OFF}$ ratio of a larger (e.g., medium) capacitor in comparison with a fine capacitor may advantageously enable an improved frequency range.

In various digital PLLs (as well as many analog PLLs), there may be a coarse frequency tuning component in the oscillator of the PLL that is controlled by digital control bits. There may also be a fine tuning component (e.g., of a digital DCO) that may enable smaller steps to maintain good jitter performance during PLL closed loop activity.

As discussed herein, in various embodiments, there may be a third level of segmentation for frequency tuning that may be referred as medium tuning bits (or dynamic temperature range (DTR) tuning bits) which may be larger than the fine tuning bits by some ratio N. An algorithm may be applied in which the medium bits are activated once the fine bits approach a specific level or threshold. This may trigger an event (which may be referred to as a "swap") in which a single medium bit may be swapped for a group of N fine bits.

FIG. 1 illustrates a scenario of capacitor-swap control bits for oscillator circuitries, in accordance with some embodiments of the disclosure. An oscillator circuitry 100 may comprise a capacitor-swap control logic 110 which may generate a medium control bit 112, which may in turn be inverted and applied to a number N of fine control bits 113. In some embodiments, capacitor-swap control logic 110 may comprise a DSCS circuitry (e.g., a delta-sigma capacitor swap circuitry). Medium control bit 112 may be coupled to a medium tuning circuitry 120, which may comprise an array of medium tuning capacitors with one or more active cells (e.g., dither cells). The medium tuning capacitors (or the medium-tuning capacitance array) may comprise a Digital to Analog Converter (DAC), and may be operable to convert a digital code to an analog quantized amount of frequency change. N fine control bits 113 may be coupled to a fine tuning circuitry 130, which may comprise an array of fine tuning capacitors with one or more active cells (e.g., dither cells).

Capacitor-swap control logic 110 may generate a predetermined sequence of values for medium control bit 112 (and thus N fine control bits 113), to control the corresponding activation and de-activation, or swapping, of associated medium bits and associated fine bits. In some embodiments, capacitor-swap control logic 110 may comprise a delta-sigma capacitor swap (DSCS) control logic (for example, comprising a delta-sigma modulator), and may generate a predetermined sequence of values in accordance with a delta-sigma (or sigma-delta) modulation pattern. The delta-sigma (or sigma-delta) modulation pattern may correspond with any of a variety of orders, such as a first-order pattern, a second-order pattern, a third-order pattern, and so on. Moreover, the delta-sigma (or sigma-delta) modulation pattern may be selected from multiple types of patterns of a particular order; accordingly, the pattern may be one of multiple types of second-order patterns, one of multiple types of third-order patterns, and so on.

In other embodiments, capacitor-swap control logic 110 may generate a predetermined sequence of values in accordance with another modulation pattern. For example, the modulation pattern may correspond with multi-stage noise shaping (MASH) modulation techniques, pulse-width modulation (PWM) techniques, or other modulation techniques. Accordingly, in various embodiments, the predetermined sequences might comprise any of a variety of dithering patterns, sequences, or schemes.

Figure 2A:
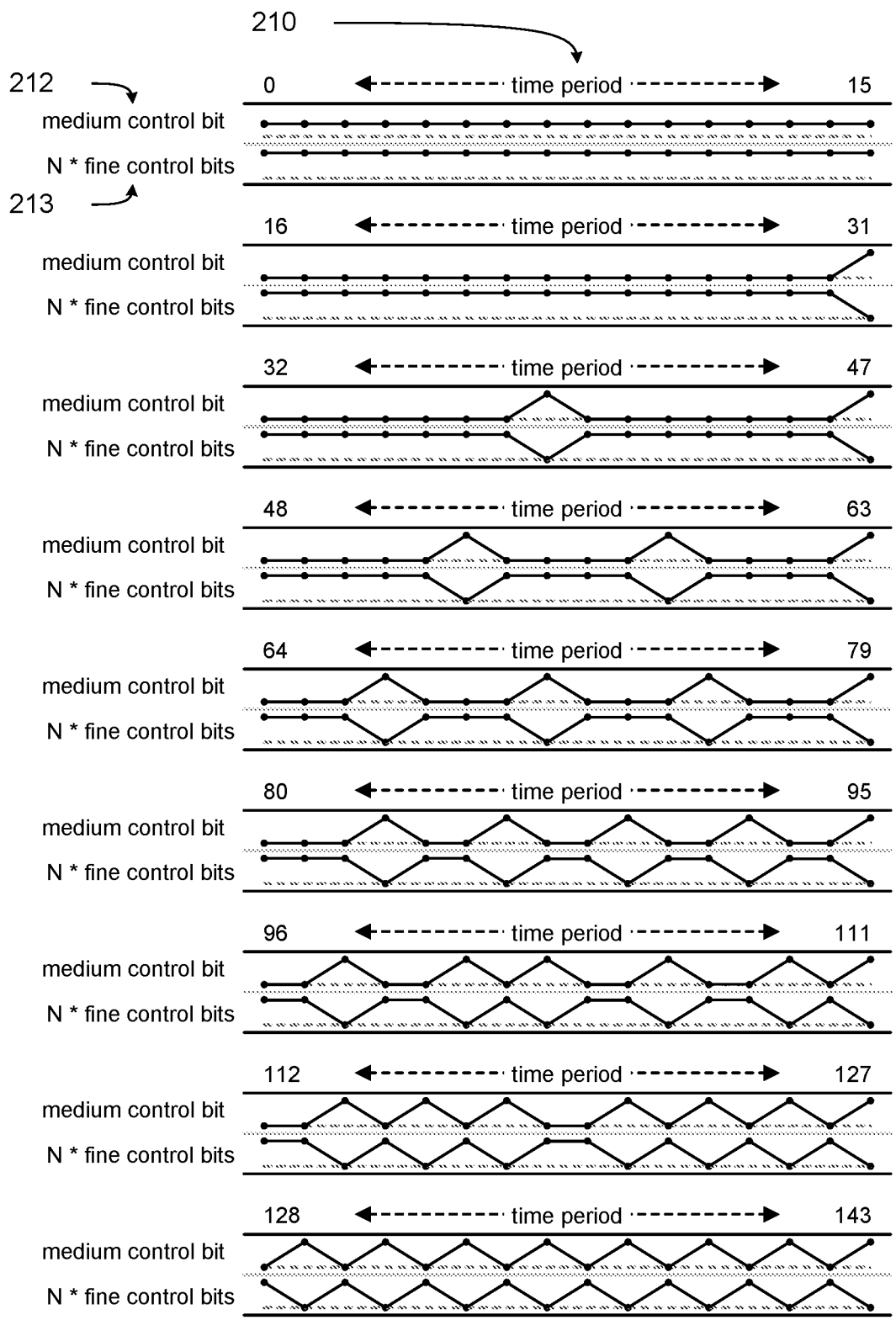
FIGS. 2A-2B illustrate a predetermined sequence for capacitor swapping, in accordance with some embodiments of the disclosure.
Figure 2B:
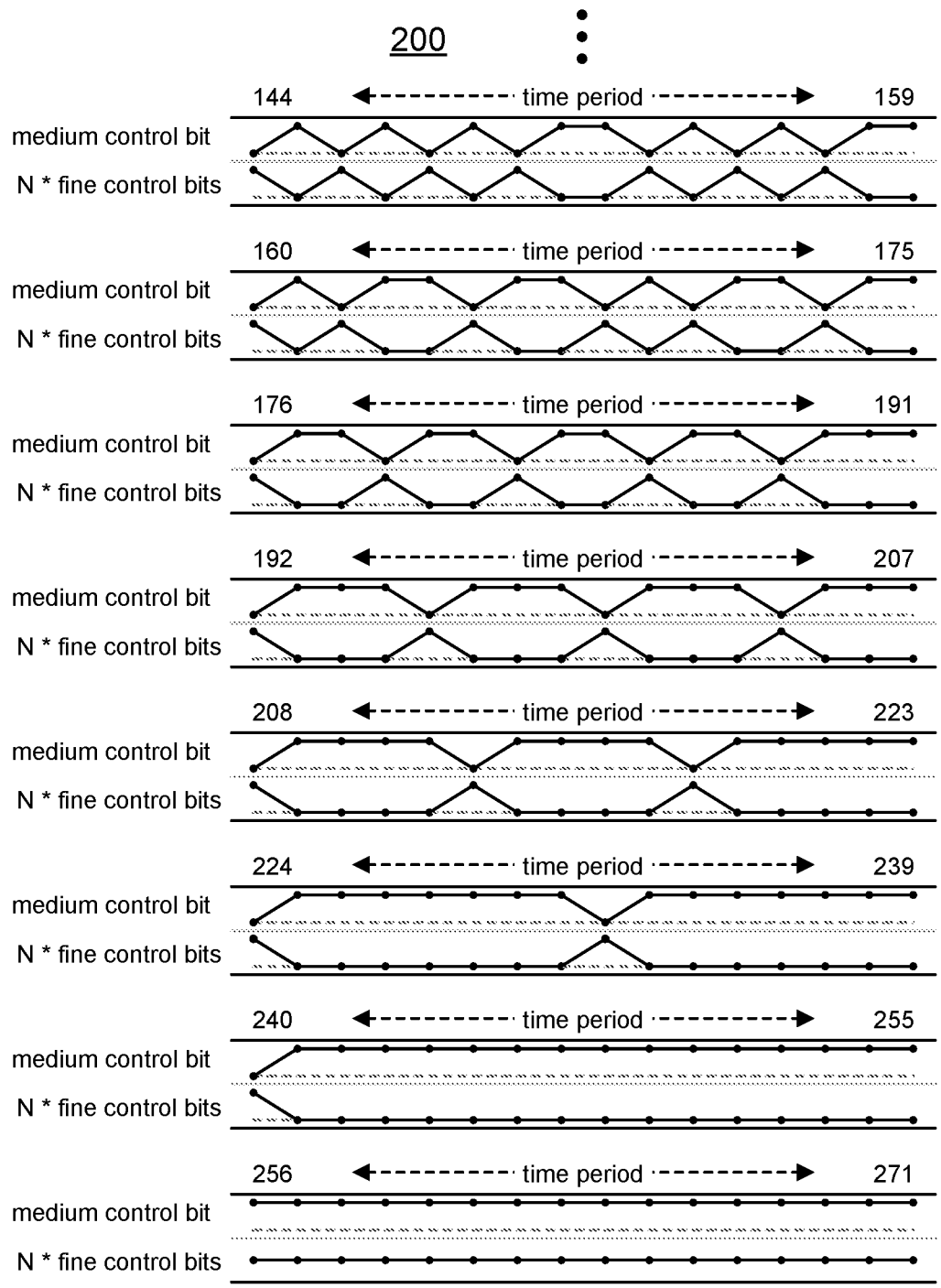

For example, FIGS. 2A-2B illustrate a predetermined sequence for capacitor swapping, in accordance with some embodiments of the disclosure. A sequence 200, which may span a time period 210, may include a sequence 212 of values for a medium control bit and a sequence 213 of values for a number N of fine control bits. At sequential points in time within time period 210 (which may relate to clock cycles, or fractions of a clock cycle, or multiples of a clock cycle), sequence 212 and sequence 213 may be generated (and/or driven) by a capacitor-swap control logic, such as capacitor-swap control logic 110. Accordingly, sequence 212 and sequence 213 may be substantially similar to sequences of values generated for (and/or driven to) medium control bit 112 and sequences of values generated for (and/or driven to) N fine control bits 113.

In various embodiments, a capacitor swap sequence may be done through a predetermined sequence, such as a digital sequence generated by a delta-sigma modulator or similar digital structure, such that a medium control bit is, in effect, digitally "ramping" on while a number N of fine control bits are simultaneously digitally "ramping" off (or vice-versa) over a predetermined amount of time.

According to another aspect of the design, the swap may actually be done gradually through a digital sequence (e.g., a digital sequence that is created by a delta sigma modulator or similar digital structure), such that it is digitally "ramping" on a medium bit while simultaneously "ramping" off a number N of fine bits off over a predetermined amount of time (or vice-versa). Thus, at the beginning of the ramping, the N fine bits may all be at a first state (e.g., an activated or "on" state), while at the end of the ramping, the N fine bits may all be at a second state (e.g., a de-activated or "off" state), or vice-versa. In various embodiments, once the ramping sequence has been completed for one medium bit, it may be undertaken for another medium bit. For some embodiments, one or more LSBs of an array of coarse bits may be used as medium bits.

Figure 3:
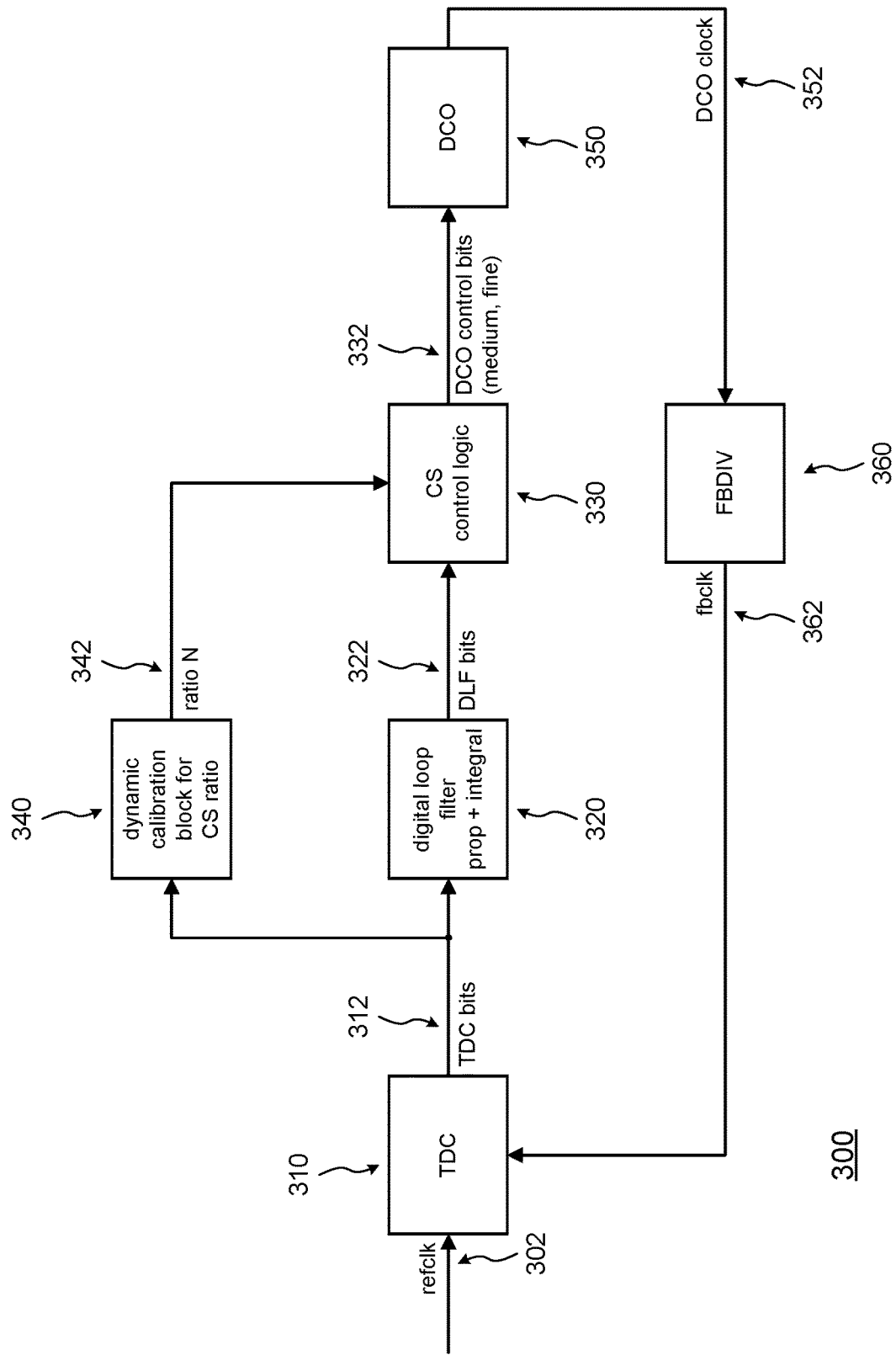
FIG. 3 illustrates a block diagram of a digital Phase Locked Loop (PLL) circuitry with a capacitor-swap control logic and a dynamic calibration block, in accordance with some embodiments of the disclosure.

FIG. 3 illustrates a block diagram of a digital PLL circuitry with a capacitor-swap control logic and a dynamic calibration block, in accordance with some embodiments of the disclosure. A digital PLL circuitry 300 may comprise a time-to-digital converter (TDC) 310, a digital loop filter (DLF) 320, a capacitor-swap control logic 330, a dynamic calibration block 340, a DCO 350, and/or a feedback divider (FBDIV) 360.

TDC 310 may accept a reference clock 302 and a feedback clock 362, and may generate a set of TDC bits 312 (which may comprise a digital representation of a clock signal). DLF 320 (which may comprise, e.g., proportion-based loop filter circuitry, integral-based loop filter circuitry, and/or other loop filter circuitry) may accept TDC bits 312, and may generate a set of DLF bits 322. Capacitor-swap control logic 330 may generate and/or drive various medium control bits for DCO 350, and/or may generate and/or drive various fine control bits for DCO 350. (In various embodiments, capacitor-swap control logic 330 may be substantially similar to capacitor-swap control logic 110, one or more of the medium control bits may be substantially similar to medium control bit 112, and one or more of the fine control bits may be substantially similar to N fine control bits 113.) In turn, DCO 350 may generate a DCO clock 352, which FBDIV 360 may use to generate feedback clock 362.

Capacitor-swap control logic 330 may also accept a ratio-N indicator 342 for capacitor swapping, which the dynamic calibration block 340 may generate on the basis of, for example, TDC bits 312. In some embodiments, capacitor-swap control logic 330 may comprise one or more registers (e.g., configuration registers) for setting an initial vale for the ratio N. For some embodiments, capacitor-swap control logic 330 may provide a DSCS ratio (e.g., a ratio N for delta-sigma based capacitor swapping).

Dynamic calibration block 340 may optionally be activated to continuously adjust ratio-N indicator 342 to account for temperature, voltage, and/or aging-induced shifts in the appropriate ratio N that may have occurred since the original ratio was calibrated and/or programmed. In some embodiments, a circuitry of dynamic calibration block 340 may slowly adjust the ratio-N indicator 342 in small, fractional increments based on TDC bits 312 from TDC 310 during a capacitor-swap ramping.

Figure 4:
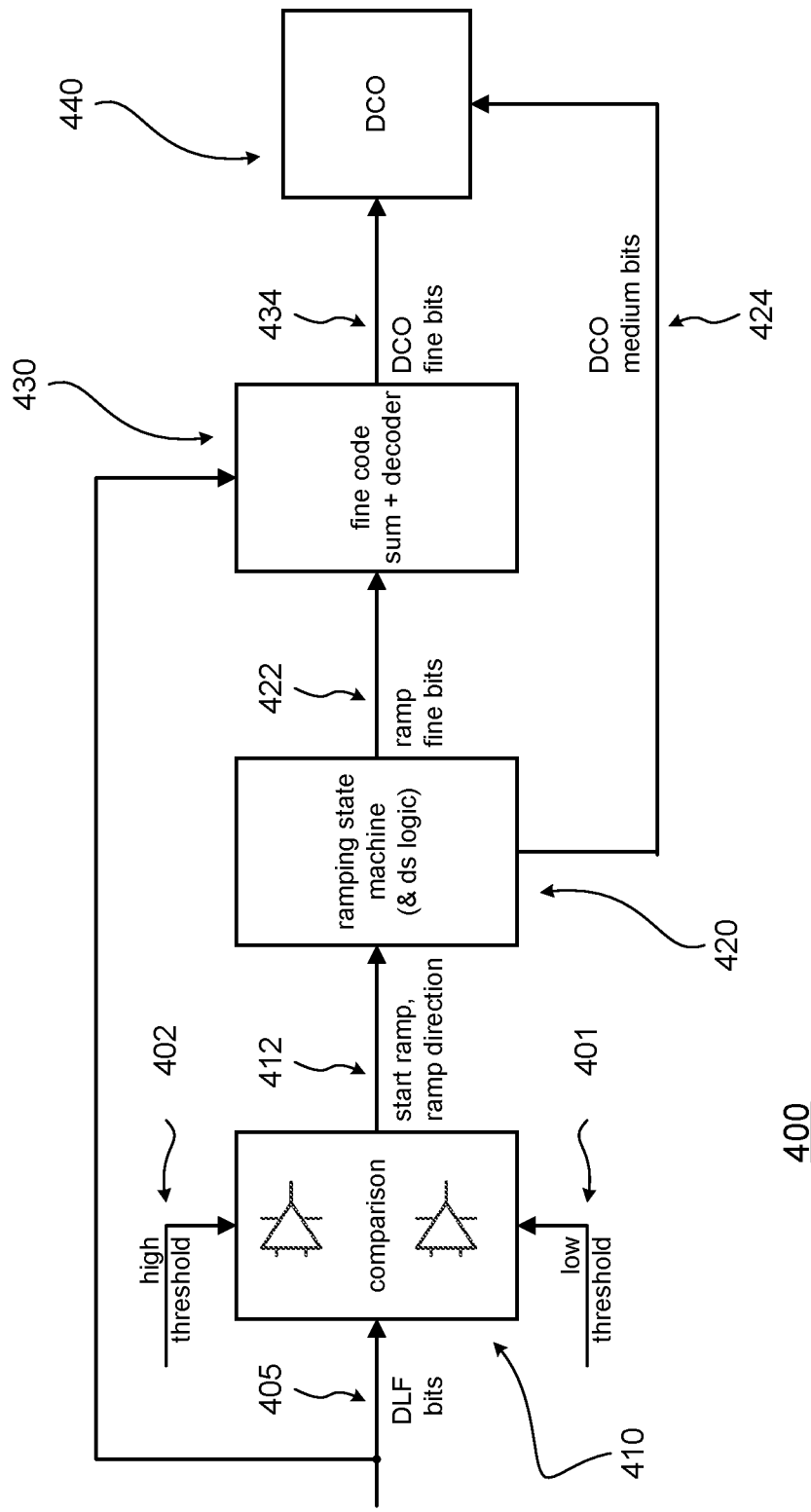
FIG. 4 illustrates a block diagram of a capacitor-swap control logic, in accordance with some embodiments of the disclosure.

FIG. 4 illustrates a block diagram of a capacitor-swap control logic, in accordance with some embodiments of the disclosure. A capacitor-swap control logic 400 may comprise a comparison circuitry 410, a ramping state machine circuitry 420, a fine code sum and decoder circuitry 430, and a DCO 440. In some embodiments, capacitor-swap control logic 400 may comprise a DSCS control logic circuitry. In various embodiments, capacitor-swap control logic 400 may be substantially similar to capacitor-swap control logic 330 and/or capacitor-swap control logic 110.

Comparison circuitry 410 may take a set of DLF bits 405 (which may be substantially similar to DLF bits 322) as well as a low threshold 401 and/or a high threshold 402. DLF bits 432 may comprise a fine code. In some embodiments, low threshold 401 and high threshold 402 may be provided by registers programmed by a user (e.g., configuration registers). Comparison circuitry 410 may determine whether the fine code is within a specified range, such as a range established by low threshold 401 and/or high threshold 402. For example, a code may outside of a specified range when it is below low threshold 401 or above high threshold 402.

Comparison circuitry 410 may generate ramp indicators 412 for ramping state machine circuitry 420. Ramp indicators 412 may comprise a start ramp indicator and/or a ramp direction indicator. Once the fine code is no longer within the specified range (e.g., falls lower than low threshold 401 or raises higher than high threshold 402), comparison circuitry 410 may assert the start ramp indicator.

Ramping state machine circuitry 420 may sense the start ramp indicator, and may drive a set of ramping fine bits 422. (In some embodiments, "ramping" or "ramp" may correspond with a delta sigma capacitance-swap sequence, as discussed herein.) Ramping state machine circuitry 420 may be operable to provide a DCO medium bits indicator 424 (e.g., a DCO medium bits word).

Ramping state machine circuitry 420 may perform a ramp for a 0 to 1 transition (e.g., a ramping of a medium bit from a logic low or de-activated state to a logic high or activated state), or a ramp for a 1 to 0 transition. In some embodiments, ramping state machine circuitry 420 may be designed or configured to respond to a start ramp indicator while not in the middle of a ramp, or when it has completed a ramp from the last assertion of the start ramp indicator. In various embodiments, ramping state machine circuitry 420 may also apply additional criteria to the regulate the start of a ramp, such as a required amount of time having elapsed between ramps, which may advantageously control a rate at which ramps may occur.

Fine code sum and decoder circuitry 430 may be operable to combine ramping fine bits 422 and portions of DLF bits 405 (e.g., a fine code of DLF bits 405) into a DCO fine bits indicator 434 (e.g., a DCO fine bits word). Fine code sum and decoder circuitry 430 may be implemented in a variety of different ways, including by a rotating address scheme such that a ramp may affect a different portion of the array than an active closed-loop digital PLL, or by a logical sum operation.

With respect to FIGS. 1-4, in a variety of embodiments, an apparatus which may be at least part of a clocking circuitry may comprise a first circuitry, a second circuitry, a first capacitor array, and a second capacitor array. The first circuitry, which may be substantially similar to oscillator circuitry 100 and/or digital PLL circuitry 300, may have an oscillator (e.g., a DCO). The first capacitor array may have a set of first capacitors to tune the oscillator (e.g., a set of fine-tuning capacitors). The second capacitor array may have a second capacitor to tune the oscillator (e.g., a medium-tuning capacitor, or an LSB coarse-tuning capacitor). A capacitance of the second capacitor may be greater than an average capacitance of the first capacitors. The second circuitry may be operable to synchronously activate the second capacitor and deactivate a number N of the first capacitors, and to synchronously deactivate the second capacitor and activate the N first capacitors, based on a predetermined sequence.

In some embodiments, the apparatus may comprise an LC tank based PLL clock circuitry, such as digital PLL circuitry 300. For some embodiments, the apparatus may comprise a DLL clock circuitry. In some embodiments, the oscillator may comprise a DCO, such as DCO 350 and/or DCO 440. For some embodiments, the predetermined sequence may comprise a delta-sigma modulation sequence and/or or a sigma-delta modulation sequence.

In some embodiments, the first capacitor array may comprise a fine-tune capacitor array. For some embodiments, the second capacitor array may comprise a coarse-tune capacitor array, and the second capacitor may correspond with a least significant bit of the coarse-tune capacitor array. Some embodiments may comprise a third capacitor array, which may comprise a coarse-tune capacitor array.

Some embodiments may comprise an additional circuitry operable to establish the number N, which may be substantially similar to dynamic calibration block 340. In some such embodiments, an initial value of the number N may be based on a ratio of the capacitance of the second capacitor to the average capacitance of the first capacitors. For some embodiments, an initial value of the number N may be provided by one or more configurable registers.

Some embodiments may comprise an additional circuitry (which may be substantially similar to capacitor-swap control logic 400 and/or comparison circuitry 410) operable to provide one or more threshold values, such as low threshold 401 and/or high threshold 402. In some such embodiments, the second circuitry may be operable to activate and deactivate the first capacitors and second capacitors based on the predetermined sequence when a number of the first capacitors that have been activated is outside of a range established by the one or more threshold values.

In a variety of embodiments, an apparatus which may be at least part of a clocking circuitry may comprise a first circuitry a second circuitry, a first capacitor array, and a second capacitor array. The first circuitry, which may be substantially similar to oscillator circuitry 100 and/or digital PLL circuitry 300, may have a DCO. The first capacitor array may have a set of first capacitors to tune the DCO at a first level of granularity (e.g., a set of fine-tuning capacitors). The second capacitor array may have a set of second capacitors to tune the DCO at a second level of granularity greater than the first level of granularity (e.g., a medium-tuning capacitor, or an LSB coarse-tuning capacitor). The second circuitry may be operable to synchronously activate the second capacitor and deactivate of a number N of the first capacitors, and to synchronously deactivate the second capacitor and activate the N first capacitors, based on a predetermined sequence.

In some embodiments, the apparatus may comprises an LC tank based PLL clock circuitry (such as digital PLL circuitry 300) or a DLL clock circuitry. For some embodiments, the predetermined sequence may comprise a delta-sigma modulation sequence and/or a sigma-delta modulation sequence.

Some embodiments may comprise an additional circuitry operable to establish the number N, which may be substantially similar to dynamic calibration block 340. In some such embodiments, an initial value of the number N may be based on a ratio of the capacitance of the second capacitor to the average capacitance of the first capacitors.

Some embodiments may comprise an additional circuitry (which may be substantially similar to capacitor-swap control logic 400 and/or comparison circuitry 410) operable to provide one or more threshold values, such as low threshold 401 and/or high threshold 402. In some such embodiments, the second circuitry may be operable to activate and deactivate the first capacitors and second capacitors based on the predetermined sequence when a number of the first capacitors that have been activated is outside of a range established by the one or more threshold values.

Figure 5:
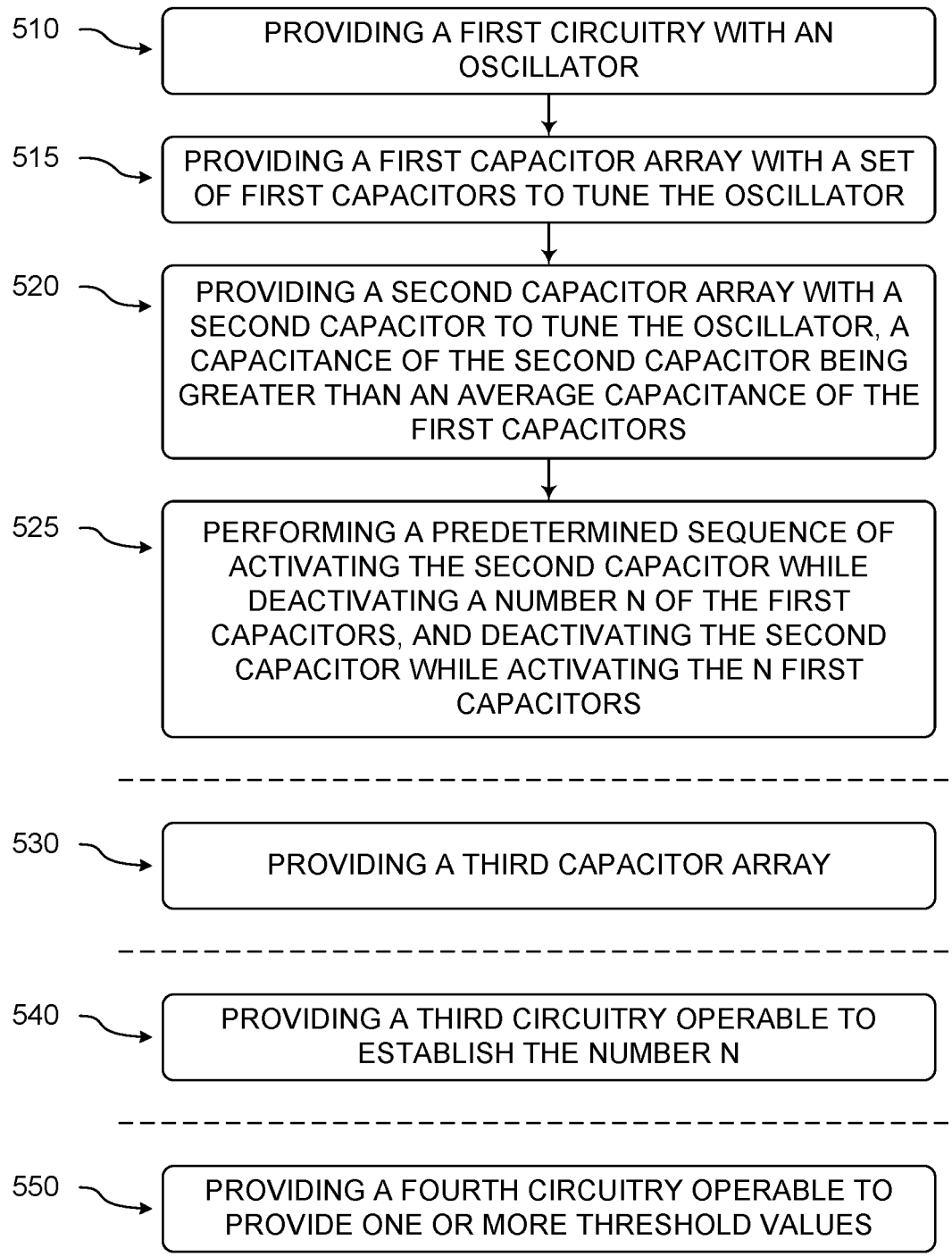
FIG. 5 illustrates methods for facilitating high-performance clock circuitry tuning, in accordance with some embodiments of the disclosure.

FIG. 5 illustrates methods for facilitating high-performance clock circuitry tuning, in accordance with some embodiments of the disclosure. A method 500 may comprise a providing 510, a providing 515, a providing 520, and a performing 525. Method 500 may also comprise a providing 530, a providing 540, and/or a providing 550.

In providing 510, a first circuitry with an oscillator (e.g., a DCO) may be provided. In providing 515, a first capacitor array with a set of first capacitors to tune the oscillator (e.g., a set of fine-tuning capacitors) may be provided. In providing 520, a second capacitor array with a second capacitor to tune the oscillator (e.g., a medium-tuning capacitor, or an LSB coarse-tuning capacitor) may be provided. A capacitance of the second capacitor may be greater than an average capacitance of the first capacitors. In performing 525, a predetermined sequence of activating the second capacitor while deactivating a number N of the first capacitors, and deactivating the second capacitor while activating the N first capacitors may be performed.

In some embodiments, the apparatus may comprise an LC tank based PLL clock circuitry (such as digital PLL circuitry 300) and/or a DLL clock circuitry. For some embodiments, the oscillator may comprise a DCO (such as DCO 350 and/or DCO 440). In some embodiments, the predetermined sequence may comprise a delta-sigma modulation sequence and/or a sigma-delta modulation sequence.

In some embodiments, the first capacitor array may comprise a fine-tune capacitor array. For some embodiments, the second capacitor array may comprises a coarse-tune capacitor array, and the second capacitor may correspond with a least significant bit of the coarse-tune capacitor array.

In providing 530, a third capacitor array may be provided. In some embodiments, the third capacitor array may comprise a coarse-tune capacitor array.

In providing 540, a third circuitry operable to establish the number N (which may be substantially similar to dynamic calibration block 340) may be provided. An initial value of the number N may be based on a ratio of the capacitance of the second capacitor to the average capacitance of the first capacitors.

In providing 550, a fourth circuitry operable to provide one or more threshold values (which may be substantially similar to capacitor-swap control logic 400 and/or comparison circuitry 410) may be provided. The second circuitry may be operable to activate and deactivate the first capacitors and second capacitors based on the predetermined sequence when a number of the first capacitors that have been activated is outside of a range established by the one or more threshold values.

Although the actions in the flowchart with reference to FIG. 5 are shown in a particular order, the order of the actions can be modified. Thus, the illustrated embodiments can be performed in a different order, and some actions may be performed in parallel. Some of the actions and/or operations listed in FIG. 5 are optional in accordance with certain embodiments. The numbering of the actions presented is for the sake of clarity and is not intended to prescribe an order of operations in which the various actions must occur. Additionally, operations from the various flows may be utilized in a variety of combinations.

In some embodiments, an apparatus may comprise means for performing various actions and/or operations of the methods of FIG. 5.

Moreover, in some embodiments, machine readable storage media may have executable instructions that, when executed, cause one or more processors to perform an operation comprising a method of FIG. 5. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In various embodiments, capacitor arrays or banks designed to provide high resolution of frequency tuning may suffer from poor $C_{ON}$ to $C_{OFF}$ ratio, in the face of which a DCO may be designed in such ways that may waste power and/or area in order to support the target frequency, and in some cases the frequency target may be jeopardized.

DCO designs may support multiple bands which may be tuned during a frequency calibration, which may also be referred to as Automatic Frequency Select (AFS), before starting a phase locking. Each band may be designed to have a wide enough range to track temperature drifts. Some extreme standards, such as Advanced Driver Assistance Systems (ADAS) standards, may be targeted to support extreme temperature drifts, for example from −40 degrees Celsius (° C.) to 125° C.

In some high-speed physical layer (PHY) designs—such as PHY designs used for Peripheral Component Interconnect Express (PCIe®), Universal Serial Bus (USB) Type-C®, Thunderbolt™, and so on—a clock recovery in a receiver may be implemented with a DCO topology of a differential ring oscillator. (PCIe® is a registered trademark and/or service mark of PCI-SIG of Beaverton, Oreg. USB Type-C® is a registered trademark of USB Implementers Forum. Thunderbolt™ is a trademark of Intel Corporation of Santa Clara, Calif., or its subsidiaries.) The frequency may be a function of a resistor-capacitor (RC) load on each stage, where the load resistance may be controlled by an AFS calibration circuitry, and the capacitor bank may be controlled by a PLL circuitry.

Some process technologies in which such PHY circuitries are used may be disposed to using metal resistors, which may suffer from high-temperature coefficients and may lead to relatively very large frequency drifts. A DCO may be targeted to reach approximately 10 gigahertz (GHz), but that frequency may be difficult-to-impossible to reach if a capacitor bank of the design is targeted to compensate for wide temperature drifts such as those discussed herein.

With respect to a variety of embodiments, disclosed herein are mechanisms and methods for dynamic adjustment of DCO band select to compensate for temperature drift while the DCO remains phase locked. A frequency spacing between bands may be too large and could cause extremely high jitter. To overcome this, in various embodiments, switches that control the band select may be controlled with a very slow ramp, from rail to rail. This may advantageously permit differential DCO design enabling robust target frequencies while retaining desirable power-consumption performance.

Figure 6A:
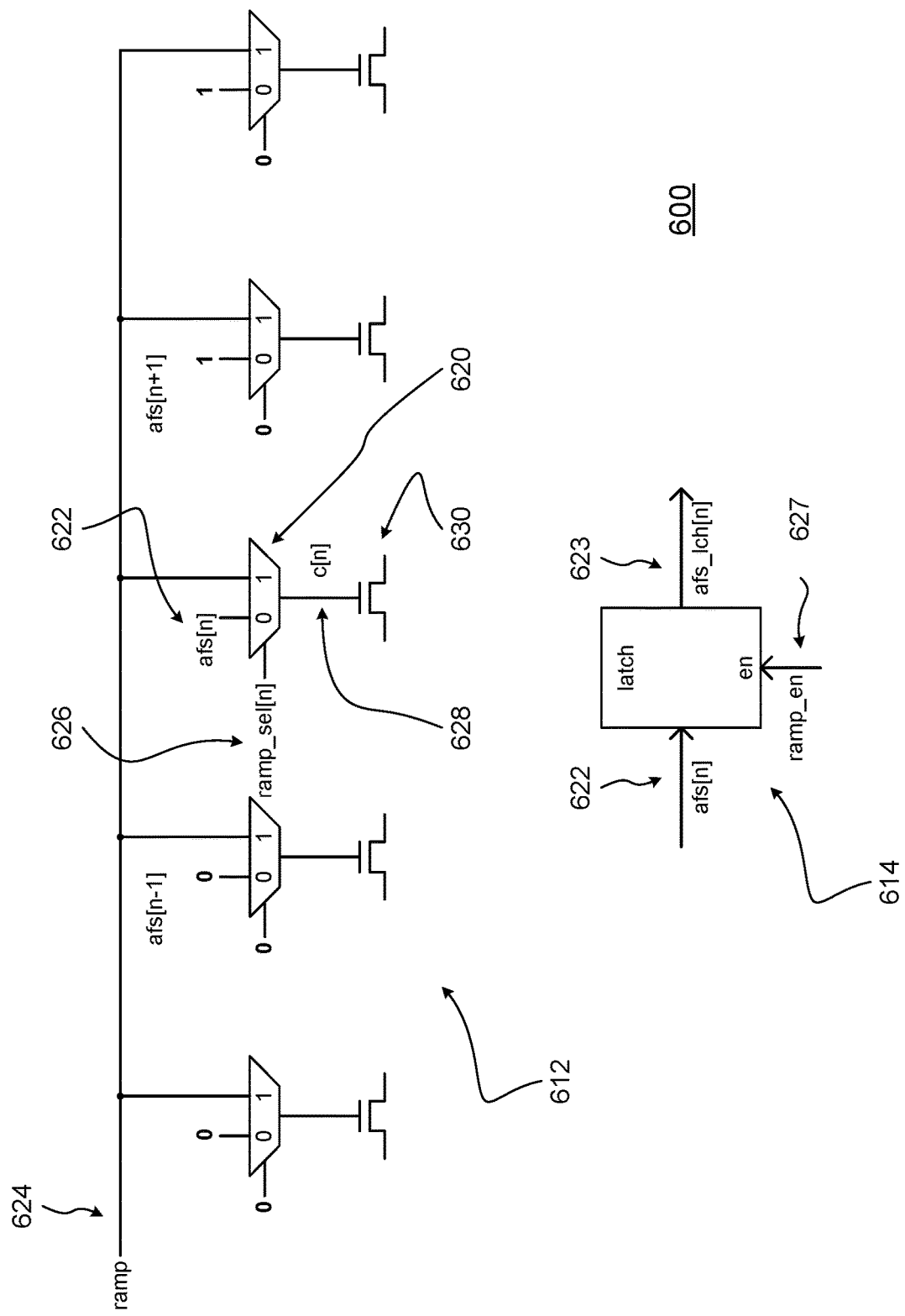
FIGS. 6A-6B illustrate a design to support Automatic Frequency Support (AFS), in accordance with some embodiments of the disclosure.
Figure 6B:
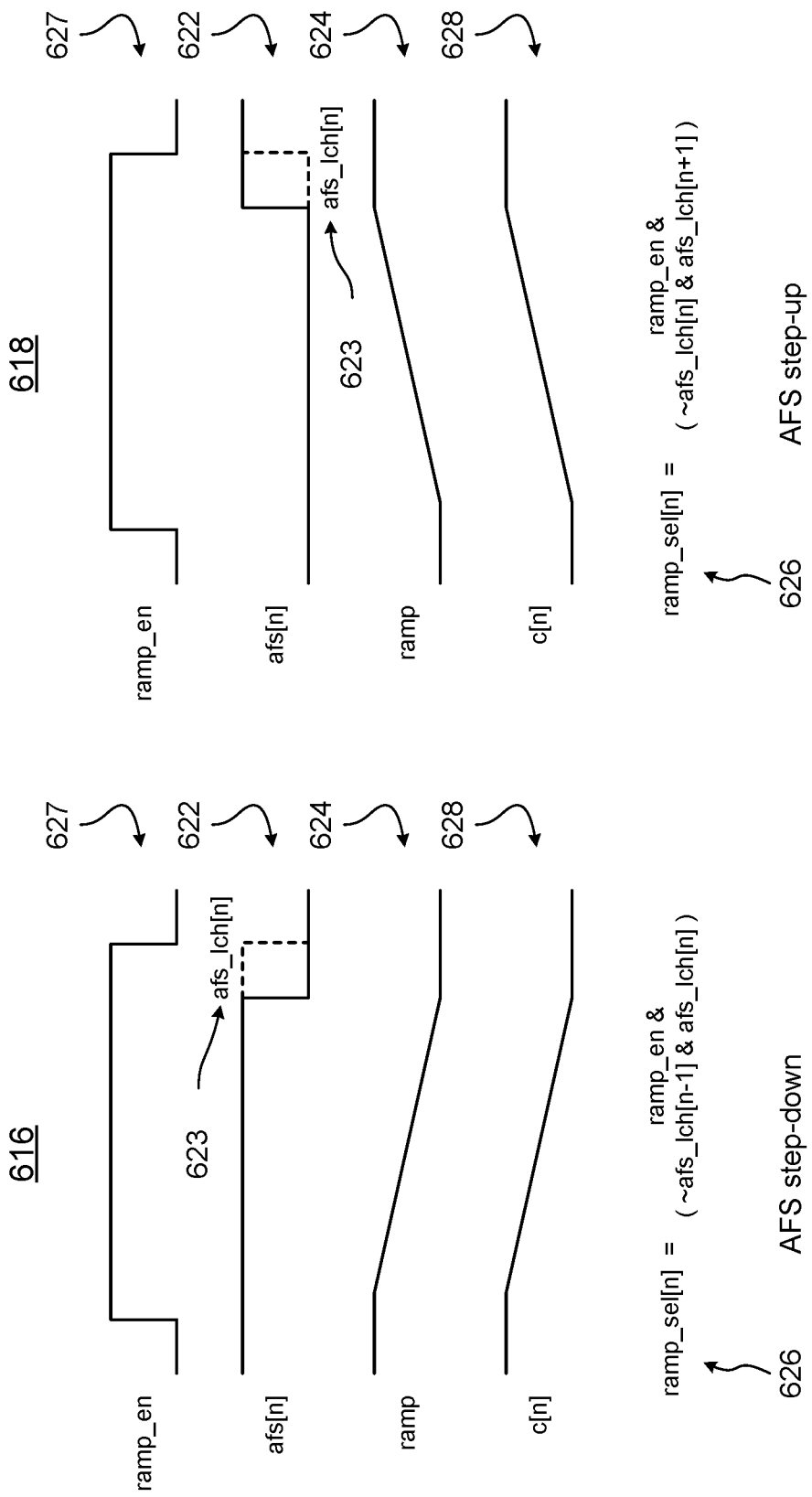

FIGS. 6A-6B illustrate a design to support AFS, in accordance with some embodiments of the disclosure. A design 600 may comprise one or more selector circuitries 612 and one or more latches 614 that respectively correspond with one or more AFS thermometer codes. Selector circuitries 612 and latches 614 may be bit-slices of multi-bit selector circuitries and multi-bit latches, respectively.

A selector circuitry 612 bit-slice may comprise a multiplexor 620 having a first data input coupled to an AFS thermometer code bit 622 (labelled as "afs[n]"), a second data input coupled to a ramp signal 624, and a selection input coupled to a ramp selection bit 626 (labelled as "ramp sel[n]"). A selector circuitry 620 may also have an output coupled to a control signal bit 628 (labelled as "c[n]"), which in turn may drive a switch 630.

Meanwhile, a latch 614 bit-slice (which may comprise, e.g., a D-latch) may have a data input (e.g., "D" input) coupled to AFS thermometer code bit 622, a data output (e.g., "Q" output) coupled to a latched AFS thermometer code bit 623, and an enable input coupled to a ramp enable bit 627.

AFS thermometer code bit 622 may be a bit-slice of a multi-bit set of AFS thermometer code bits. Similarly, latched AFS thermometer code bit 623 may be a bit-slice of a multi-bit set of latched AFS thermometer code bits. Ramp selection bit 626 may be a bit-slice of a multi-bit set of ramp selection bits, and ramp enable bit 627 may be a bit-slice of a multi-bit set of ramp enable bits. Control bit 628 may be a bit-slice of a multi-bit set of control bits.

Design 600 may operate in response to an AFS step-down as depicted in timing diagram 616. Similarly, design 600 may operate in response to an AFS step-up as depicted in timing diagram 618.

In some embodiments, in response to an AFS step-down (for example), ramp selection bit 626 may be asserted if: latched AFS thermometer code bit 623 is asserted; a next-lower latched AFS thermometer code bit is deasserted; and AFS ramp enable bit 627 is asserted. (Such a condition may occur, for example, when a stepping-down set of AFS thermometer codes has reached the bit-slice for AFS thermometer code bit 623.) Then, while ramp signal 624 is slowly ramping down from a high voltage level $V_{CC}$ to a low voltage level $V_{SS}$, multiplexor 620 may pass ramp signal 624 through to control bit 628. When ramp signal 624 completes its ramp down, AFS thermometer code bit 622 may transition low, causing latched AFS thermometer code bit 623 to transition low, which may in turn cause ramp selection bit 626 to transition low. At that time, multiplexor 620 may pass AFS thermometer code bit 622 (now low) through to control bit 628 (which will have just completed ramping down, following ramp signal 624).

In some embodiments, in response to an AFS step-up (for example), ramp selection bit 626 may be asserted if: latched AFS thermometer code bit 623 is deasserted; a next-higher latched AFS thermometer code bit is asserted; and AFS ramp enable bit 627 is asserted. (Such a condition may occur, for example, when a stepping-up set of AFS thermometer codes has reached the bit-slice for AFS thermometer code bit 623.) Then, while ramp signal 624 is slowly ramping up from low voltage level $V_{SS}$ to high voltage level $V_{CC}$, multiplexor 620 may pass ramp signal 624 through to control bit 628. When ramp signal 624 completes its ramp up, AFS thermometer code bit 622 may transition high, causing latched AFS thermometer code bit 623 to transition high, which may in turn cause ramp selection bit 626 to transition low. At that time, multiplexor 620 may pass AFS thermometer code bit 622 (now high) through to control bit 628 (which will have just completed ramping up, following ramp signal 624).

Accordingly, in various embodiments, a capacitor bank for phase locking may be controlled by a "fine code." When the fine code exceeds a lower threshold limit or an upper threshold limit, an AFS may change by one step-down or by one step-up, by turning one AFS thermometer code (e.g., AFS thermometer code bit) off or on. When such a step occurs, the control signal of the transitioning thermometer code may start ramping down or ramping up from rail to rail. For a step-down, a ramp may start from a high voltage level $V_{CC}$ to low voltage level $V_{SS}$, while for a step-up, a ramp may start from low voltage level $V_{SS}$ to high voltage level $V_{CC}$.

In various embodiments, a switch (e.g., switch 630) may receive a ramping signal only during an AFS code transition (e.g., through multiplexor 620). After a transition has completed, the switch may then receive an appropriate logic-level signal (e.g., through multiplexor 620). This may advantageously facilitate changing an AFS code while a PLL is running, at a relatively slow rate, without causing jitter, thus accommodating a narrower fine-range. In some embodiments, for example in designs incorporating a differential DCO, individual switches may activate or deactivate individual resistor units from a number of DCO stages.

In various embodiments, the ramp (e.g., of ramp signal 624) may be slow enough (mostly around the threshold of the switch) that it won't interfere with the phase lock loop and minimize jitter impact. Such a slow ramp may be provided by charging a large capacitor with a charge pump, for example, or by using a high-resolution DAC. Use of a DAC may advantageously provide better control in the ramp. For example, in some embodiments, a ramp may be implemented with a 10-bit DAC (or a DAC of another number of bits), where a configurable timer may determine a duration of each step in the DAC. For example, if the timer is set to 1 microsecond, completing a ramp from rail to rail for a 10-bit DAC may take about 1 millisecond.

Figure 7:
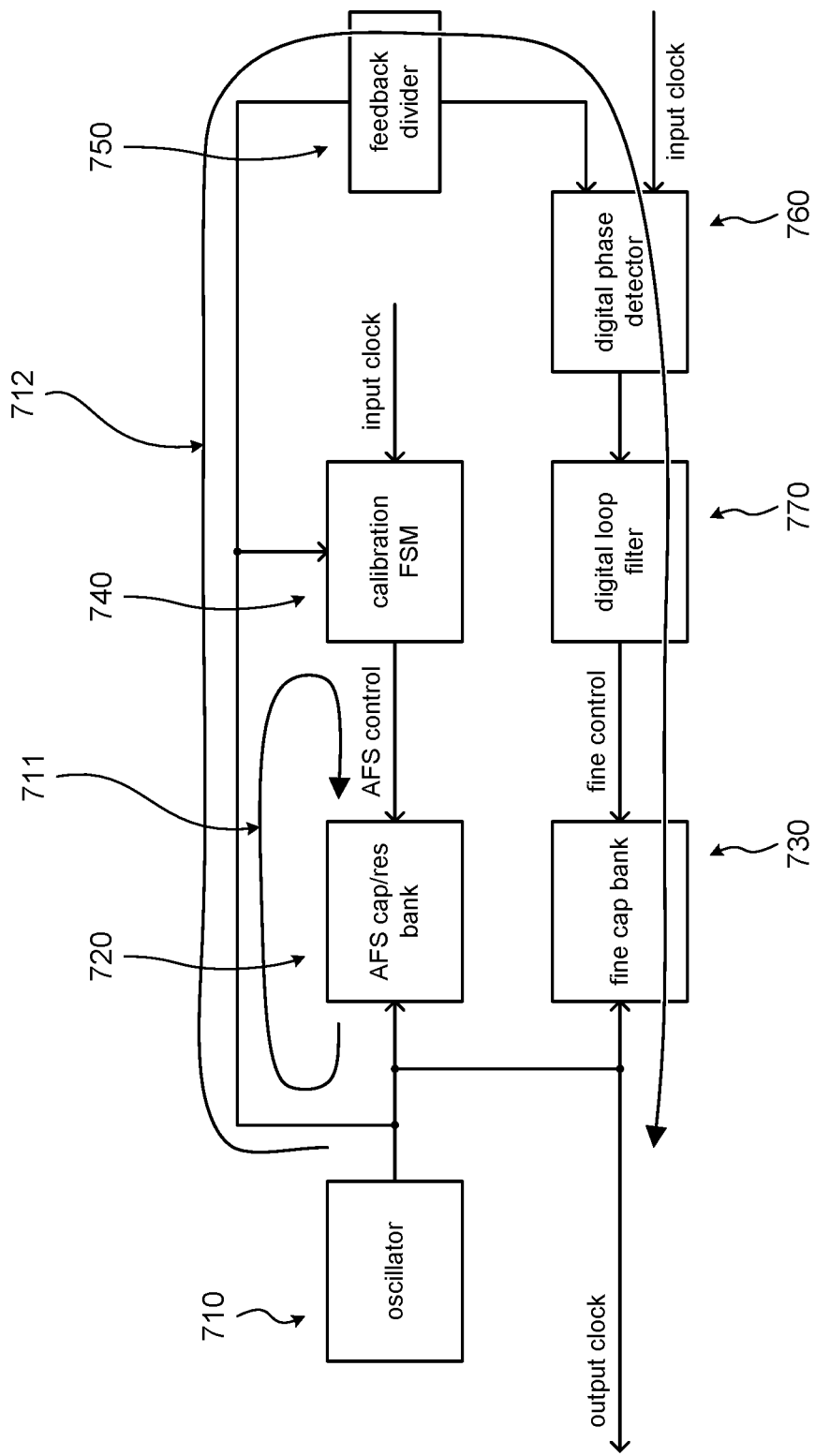
FIG. 7 illustrates a portion of a digital PLL design, in accordance with some embodiments of the disclosure.

FIG. 7 illustrates a portion of a digital PLL design, in accordance with some embodiments of the disclosure. A PLL circuitry 700 may comprise an oscillator 710 (which may include a DCO), an AFS capacitor/resistor bank 720, a fine capacitor bank 730, a calibration finite state machine (FSM) 740, a feedback divider 750, a digital phase detector 760, and a digital loop filter 770.

PLL circuitry 700 may also implement two loops. A first loop 711 may calibrate oscillator 710 by controlling an AFS array with a coarse frequency resolution. After AFS calibration is completed, a second loop 712 may operate to control the frequency for phase locking with fine frequency resolution. AFS calibration may happen first, and the phase locking may run continuously as long as the PLL is active.

In various embodiments, continuous tuning of the AFS may advantageously proceed while the PLL phase locking loop is active, to handle temperature drifts. Merely tuning the AFS by simply turning an AFS unit (e.g., a capacitor or resistor) in the AFS array on or off may cause undesirable jitter. In contrast, the methods and mechanisms disclosed herein may change AFS thermometer bits (e.g., from 0 to 1, or from 1 to 0) gradually, and with a relatively slow ramp, thereby advantageously facilitating an AFS code update without incurring undesirable jitter.

In various embodiments, an AFS may comprise capacitors or resistors (depending upon the oscillator topology). The disclosed mechanisms and methods may allow an AFS bank to operate in parallel with a fine bank while a PLL is phase locked.

Figure 8:
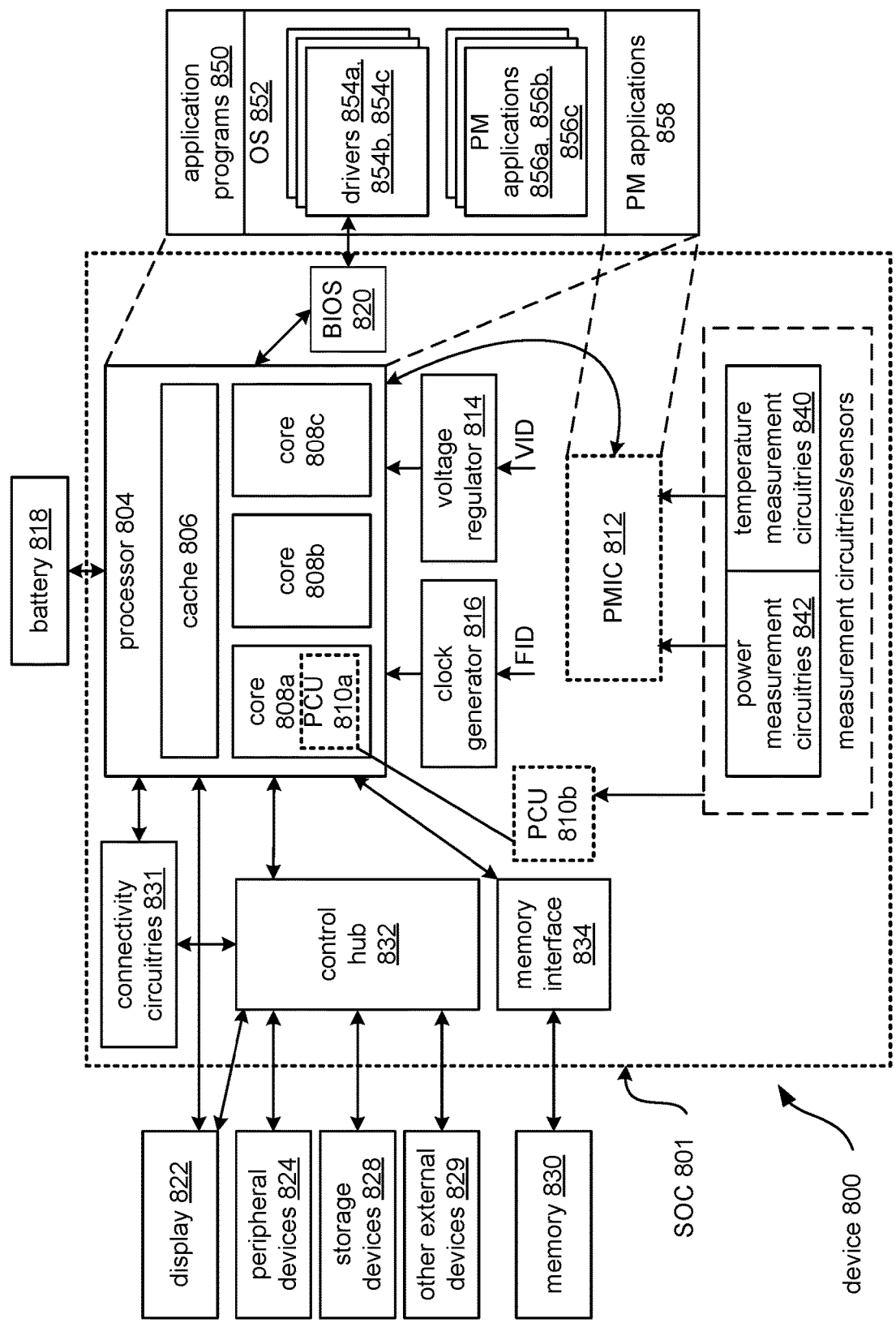
FIG. 8 illustrates a computer system or computing device with mechanisms for facilitating high-performance clocking circuitry tuning and for dynamic adjustment of DCO band select, in accordance with some embodiments.

FIG. 8 illustrates a computer system or computing device with mechanisms for facilitating high-performance clocking circuitry tuning and for dynamic adjustment of DCO band select, in accordance with some embodiments. It is pointed out that those elements of FIG. 8 having the same reference numbers (or names) as the elements of any other figure may operate or function in any manner similar to that described, but are not limited to such.

In some embodiments, a device 800 may comprise an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 800.

In some embodiments, device 800 may comprise a System-on-Chip (SoC) 801. An example boundary of SoC 801 is depicted using dotted lines in FIG. 8, with some example components depicted as being included within SoC 801. However, SoC 801 may include any appropriate components of device 800.

In some embodiments, device 800 may comprise a processor 804. Processor 804 may include one or more physical devices, such as microprocessors, application processors, microcontrollers, programmable logic devices, processing cores, or other processing means. The processing operations performed by processor 804 may include the execution of an operating system or an operating platform on which applications and/or device functions are, in turn, executed. The processing operations may include operations related to I/O (input/output) either with a human user or with other devices, operations related to power management, operations related to connecting computing device 800 to another device, and/or the like. The processing operations may also include operations related to audio I/O and/or display I/O.

In some embodiments, processor 804 may comprise multiple processing cores 808a, 808b, and 808c (also referred to as cores). Although three cores 808a, 808b, and 808c are depicted in FIG. 8, processor 804 may include any appropriate number of cores, e.g., tens of cores or even hundreds of cores. Cores 808a, 808b, and/or 808c may be implemented on a single integrated circuit (IC) chip. Moreover, the chip may include one or more shared and/or private caches, buses or interconnections, graphics and/or memory controllers, and/or other components.

In some embodiments, processor 804 may comprise a cache 806. In some embodiments, sections of cache 806 may be dedicated to individual cores (e.g., a first section of cache 806 may be dedicated to core 808a, a second section of cache 806 may be dedicated to core 808b, and so on). For some embodiments, one or more sections of cache 806 may be shared among two or more of the cores. Cache 806 may be split into different levels, e.g., a level 1 (L1) cache, a level 2 (L2) cache, a level 3 (L3) cache, and so on.

In some embodiments, cores 808a, 808b, and/or 808c may include a fetch unit to fetch instructions (including instructions with conditional branches) for execution by the core. The instructions may be fetched from a memory 830 (which may comprise any of a variety of storage devices). Cores 808a, 808b, and/or 808c may also include a decode unit to decode the fetched instruction. For some embodiments, the decode unit may decode fetched instruction into a plurality of micro-operations. Cores 808a, 808b, and/or 808c may also include a schedule unit to perform various operations associated with storing decoded instructions. In some embodiments, the schedule unit may hold data from the decode unit until the instructions are ready for dispatch, e.g., until all source values of a decoded instruction become available. For some embodiments, the schedule unit may schedule and/or issue (or dispatch) decoded instructions to an execution unit for execution.

The execution unit may execute dispatched instructions after they are decoded (e.g., by the decode unit) and dispatched (e.g., by the schedule unit). In some embodiments, the execution unit may include more than one type of execution unit (such as an imaging computational unit, a graphics computational unit, a general-purpose computational unit, and so on). The execution unit may also perform various arithmetic operations such as addition, subtraction, multiplication, and/or division, and may include one or more arithmetic logic units (ALUs). For some embodiments, a co-processor (not shown) may perform various arithmetic operations in conjunction with the execution unit.

Furthermore, the execution unit may execute instructions out-of-order. Accordingly, in some embodiments, cores 808a, 808b, and/or 808c may comprise an out-of-order processor core. Cores 808a, 808b, and/or 808c may also include a retirement unit. The retirement unit may retire executed instructions after they are committed. For some embodiments, retirement of the executed instructions may result in processor state being committed from the execution of the instructions, physical registers used by the instructions being de-allocated, and so on. Cores 808a, 808b, and/or 808c may also include a bus unit to enable communication between components of the core and other components via one or more buses. Cores 808a, 808b, and/or 808c may additionally include one or more registers to store data accessed by various components of the core (such as values related to assigned app priorities and/or sub-system states (modes) association.

In some embodiments, device 800 may comprise one or more connectivity circuitries 831, which may include hardware devices (e.g., wireless and/or wired connectors and communication hardware) and/or software components (e.g., drivers, protocol stacks, and so on) to enable device 800 to communicate with external devices. Device 800 may be separate from the external devices, such as other computing devices, wireless access points or base stations, and so on.

In some embodiments, connectivity circuitries 831 may include circuitries directed toward multiple different types of connectivity (e.g., connectivity protocols). To generalize, connectivity circuitries 831 may include cellular connectivity circuitries, wireless connectivity circuitries, and so on. Cellular connectivity circuitries of connectivity circuitries 831 may refer generally to cellular network connectivity provided by wireless carriers, such as via GSM (global system for mobile communications) or variations or derivatives thereof, via CDMA (code division multiple access) or variations or derivatives thereof, via TDM (time division multiplexing) or variations or derivatives thereof, via 3rd Generation Partnership Project (3GPP) Universal Mobile Telecommunications Systems (UMTS) system or variations or derivatives thereof, via 3GPP Long-Term Evolution (LTE) system or variations or derivatives thereof, via 3GPP LTE-Advanced (LTE-A) system or variations or derivatives thereof, via Fifth Generation (5G) wireless system or variations or derivatives thereof, via 5G mobile networks system or variations or derivatives thereof, via 5G New Radio (NR) system or variations or derivatives thereof, or via other cellular service standards.

Wireless connectivity circuitries (or wireless interfaces) of connectivity circuitries 831 may refer generally to wireless connectivity that is not cellular, and may include personal area networks (such as Bluetooth, Near Field, and so on), local area networks (such as Wi-Fi), wide area networks (such as WiMax), and/or other wireless communication. For some embodiments, connectivity circuitries 831 may include a network interface, such as a wired or wireless interface, so that a system embodiment may be incorporated into a wireless device (for example, into a cell phone or a personal digital assistant).

In some embodiments, device 800 may comprise a control hub 832, which may represent hardware devices and/or software components related to interaction with one or more I/O devices. Control hub 832 may be a chipset, a Platform Control Hub (PCH), and/or the like. Via control hub 832, processor 804 may communicate with a display 822 (or one or more displays), one or more peripheral devices 824, one or more storage devices 828, one or more other external devices 829, and so on.

Control hub 832 may provide one or more connection points for additional devices that connect to device 800, through which a user might interact with the system. In some embodiments, devices that can be attached to device 800 (e.g., external devices 829) may include microphone devices, speaker or stereo systems, audio devices, video systems or other display devices, keyboard or keypad devices, and/or other I/O devices for use with specific applications such as card readers or other devices.

As mentioned above, control hub 832 can interact with audio devices, display 822, and so on. In some embodiments, input through a microphone or other audio device may provide input or commands for one or more applications or functions of device 800. Additionally, audio output may be provided instead of, or in addition to display output. For some embodiments, if display 822 includes a touch screen, display 822 may also act as an input device, which may be at least partially managed by control hub 832. There may also be additional buttons or switches on computing device 800 to provide I/O functions managed by control hub 832. In some embodiments, control hub 832 may manage devices such as accelerometers, cameras, light sensors or other environmental sensors, or other hardware that can be included in device 800. The input may be part of direct user interaction, and may also provide environmental input to the system to influence its operations (such as filtering for noise, adjusting displays for brightness detection, applying a flash for a camera, or other features).

In some embodiments, control hub 832 may couple to various devices using any appropriate communication protocol, e.g., PCIe (Peripheral Component Interconnect Express), USB (Universal Serial Bus), Thunderbolt, High Definition Multimedia Interface (HDMI), Firewire, and so on.

In some embodiments, display 822 may represent hardware components (e.g., display devices) and software components (e.g., drivers) that provide a visual and/or tactile display for a user to interact with device 800. Display 822 may include a display interface, a display screen, and/or hardware device used to provide a display to a user. In some embodiments, display 822 may include a touch screen (or touch pad) device that provides both output and input to a user. In some embodiments, display 822 may communicate directly with processor 804. Display 822 may be an internal display device (e.g., as in a mobile electronic device or a laptop device) or an external display device attached via a display interface (e.g., DisplayPort, and so on). For some embodiments, display 822 may be a head mounted display (HMD) such as a stereoscopic display device for use in virtual reality (VR) applications or augmented reality (AR) applications.

In some embodiments, in addition to (or instead of) processor 804, device 800 may include a Graphics Processing Unit (GPU) (not depicted in the figure). The GPU may comprise one or more graphics processing cores, which may control one or more aspects of displaying contents on display 822.

For some embodiments, control hub 832 may include hardware interfaces and connectors, as well as software components (e.g., drivers, protocol stacks, and so on) to make peripheral connections, e.g., to peripheral devices 824.

It will be understood that device 800 could both be a peripheral device to other computing devices, as well as have peripheral devices connected to it. Device 800 may have a "docking" connector to connect to other computing devices for purposes such as managing content (e.g., downloading and/or uploading, changing, and/or synchronizing content) on device 800. Additionally, a docking connector may allow device 800 to connect to certain peripherals that allow computing device 800 to control content output (e.g., to audiovisual systems and/or other systems).

In addition to a proprietary docking connector or other proprietary connection hardware, device 800 may make peripheral connections via common or standards-based connectors. Such connectors may include a Universal Serial Bus (USB) connector (which may include any of a number of different hardware interfaces), a DisplayPort connector or MiniDisplayPort (MDP) connector, a High Definition Multimedia Interface (HDMI) connector, a Firewire connector, or other types of connectors.

In some embodiments, connectivity circuitries 831 may be coupled to control hub 832, e.g., in addition to, or instead of, being coupled directly to processor 804. In some embodiments, display 822 may be coupled to control hub 832, e.g., in addition to, or instead of, being coupled directly to processor 804.

In some embodiments, device 800 may comprise memory 830, which may be coupled to processor 804 via a memory interface 834. Memory 830 may include memory devices for storing information in device 800. Memory devices may include nonvolatile memory devices (for which state might not change if power to the memory device is interrupted) and/or volatile memory devices (for which state may be indeterminate, or lost, if power to the memory device is interrupted). Memory 830 may comprise a dynamic random access memory (DRAM) device, a static random access memory (SRAM) device, a flash memory device, a phase-change memory device, or another memory device (e.g., a memory device having performance suitable for serving as process memory). In some embodiments, memory 830 may operate as system memory for device 800, to store data and instructions for use when the one or more processors (e.g., processor 804) executes an application or process. Memory 830 may store application data, user data, music, photos, documents, or other data, as well as system data (whether long-term or temporary) related to the execution of the applications and functions of device 800.

Elements of various embodiments and examples may also be provided as a machine-readable medium (e.g., memory 830) for storing the computer-executable instructions (e.g., instructions to implement any other processes discussed herein). The machine-readable medium (e.g., memory 830) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. Some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, one or more measurement circuitries and/or sensors of device 800 may comprise temperature measurement circuitries 840, e.g., for measuring temperature of various components of device 800. In some embodiments, temperature measurement circuitries 840 may be embedded, or coupled or attached to various components, whose temperature are to be measured and monitored. For some embodiments, temperature measurement circuitries 840 may measure temperatures of (or within) one or more of cores 808*a*, 808*b*, 808*c*, a voltage regulator 814, memory 830, a mother-board of SoC 801, and/or any other appropriate component of device 800.

In some embodiments, the measurement circuitries and/or sensors of device 800 may comprise one or more power measurement circuitries 842, e.g., for measuring power consumed by one or more components of the device 800. For some embodiments, power measurement circuitries 842 may measure power, voltage, and/or current. In some embodiments, power measurement circuitries 842 may be embedded, coupled, or attached to various components whose power, voltage, and/or current consumption are to be measured and monitored. For some embodiments, power measurement circuitries 842 may measure: power, voltage, and/or current supplied by voltage regulator 814 (which may comprise one or more voltage regulator); power supplied to SoC 801; power supplied to device 800; power consumed by processor 804 (or any other component) of device 800; and so on.

In some embodiments, device 800 may comprise one or more voltage regulator circuitries in voltage regulator 814. Voltage regulator 814 may generate signals at appropriate voltage levels, which may be supplied to operate any appropriate components of the device 800. As an example, voltage regulator 814 is depicted as supplying one or more signals (e.g., voltage signals) to processor 804 of device 800. In some embodiments, voltage regulator 814 may receive one or more Voltage Identification (VID) signals, and generates the voltage signals (e.g., to processor 804) at appropriate levels, based on the VID signals. Various type of VRs may be utilized for voltage regulator 814. In some embodiments, voltage regulator 814 may include a "buck" voltage regulator, a "boost" voltage regulator, a combination of buck and boost voltage regulators, low dropout (LDO) regulators, switching DC-DC regulators, and so on. Buck voltage regulators may be used in power delivery applications in which an input voltage is transformed to an output voltage in a ratio that is smaller than unity. Boost voltage regulators may be used in power delivery applications in which an input voltage is transformed to an output voltage in a ratio that is larger than unity. In some embodiments, each processor core may have its own voltage regulator, which may be controlled by a Power Control Unit (PCU) 810*a*, a PCU 810*b*, and/or a Power Management Integrated Circuit (PMIC) 812. In some embodiments, each core may have a network of distributed LDOs to provide efficient control for power management. The LDOs may be digital, analog, or a combination of digital or analog LDOs.

In some embodiments, device 800 may comprise one or more clock generator circuitries in a clock generator 816. Clock generator 816 generates clock signals at appropriate frequency levels, which may be supplied to any appropriate components of device 800. As an example, clock generator 816 is depicted as supplying clock signals to processor 804 of device 800. In some embodiments, clock generator 816 may receive one or more Frequency Identification (FID) signals, and may generate the clock signals at an appropriate frequency, based on the FID signals.

In some embodiments, device 800 may comprise a battery 818 supplying power to various components of device 800. As an example, battery 818 is depicted as supplying power to processor 804. Although not depicted in the figures, device 800 may comprise a charging circuitry, e.g., to recharge the battery based on an Alternating Current (AC) power supply received from an AC adapter.

In some embodiments, device 800 may comprise PCU 810*a* and/or PCU 810*b* (which may also be referred to as Power Management Units (PMUs), Power Controllers, and so on). In some embodiments, PCU 810*a* may be implemented by one or more of cores 808*a*, 808*b*, and/or 808*c*, as is symbolically depicted using a dotted box labelled PCU 810*a*. For some embodiments, PCU 810*b* may be implemented outside the cores, as is symbolically depicted using a dotted box labelled PCU 810*b*. PCU 810*a* and/or PCU 810*b* may implement various power management operations for device 800. PCU 810*a* and/or PCU 810*b* may include hardware interfaces, hardware circuitries, connectors, registers, and so on, as well as software components (e.g., drivers, protocol stacks), to implement various power management operations for device 800.

In some embodiments, device 800 may comprise PMIC 812, e.g., to implement various power management operations for device 800. In some embodiments, PMIC 812 may be a Reconfigurable Power Management ICs (RPMICs) and/or an IMVP (Intel® Mobile Voltage Positioning). In some embodiments, the PMIC may be within an IC chip separate from processor 804. The may implement various power management operations for device 800. PMIC 812 may include hardware interfaces, hardware circuitries, connectors, registers, and so on, as well as software components (e.g., drivers, protocol stacks), to implement various power management operations for device 800.

For some embodiments, device 800 may comprise PCU 810*a*, PCU 810*b*, and/or PMIC 812. In some embodiments, any one of PCU 810*a*, PCU 810*b*, and/or PMIC 812 may be absent in device 800, and hence, these components are depicted using dotted lines.

Various power management operations of device 800 may be performed by PCU 810*a*, PCU 810*b*, PMIC 812, or by a combination thereof. For some embodiments, PCU 810*a*, PCU 810*b*, and/or PMIC 812 may select a power state (e.g., a P-state) for various components of device 800. In some embodiments, PCU 810*a*, PCU 810*b*, and/or PMIC 812 may select a power state for various components of device 800 (e.g., in accordance with the ACPI (Advanced Configuration and Power Interface) specification). In some embodiments, for example, PCU 810*a*, PCU 810*b*, and/or PMIC 812 may cause various components of the device 800 to transition to a sleep state, to an active state, to an appropriate C state (e.g., C0 state, or another appropriate C state, in accordance with the ACPI specification), and so on.

For some embodiments, PCU 810*a*, PCU 810*b*, and/or PMIC 812 may control a voltage output by voltage regulator 814 and/or a frequency of a clock signal output by the clock generator, e.g., by outputting the VID signals and/or the FID signals, respectively. In some embodiments, PCU 810*a*, PCU 810*b*, and/or PMIC 812 may control battery power usage, charging of battery 818, and features related to power saving operation.

Clock generator 816 may comprise a PLL, frequency locked loop (FLL), or any suitable clock source. In some embodiments, clock generator 816 may comprise mechanisms for facilitating high-performance clocking circuitry tuning, such as medium control bits and fine control bits that are synchronously activated and de-activated as directed by a capacitor swap logic, as discussed herein. In some embodiments, clock generator 816 may comprise mechanisms for dynamic adjustment of DCO band select to compensate for temperature drift while the DCO remains phase-locked. In some embodiments, each core of processor 804 may have its own clock source. As such, each core may operate at a frequency independent of the frequency of operation of the other core. In some embodiments, PCU 810*a*, PCU 810*b*, and/or PMIC 812 may perform adaptive or dynamic frequency scaling or adjustment. For some embodiments, clock frequency of a processor core may be increased if the core is not operating at its maximum power consumption threshold or limit. In some embodiments, PCU 810*a*, PCU 810*b*, and/or PMIC 812 may determine the operating condition of each core of a processor, and may opportunistically adjust frequency and/or power supply voltage of that core without the core clocking source (e.g., a PLL of that core) losing lock when PCU 810*a*, PCU 810*b*, and/or PMIC 812 determines that the core is operating below a target performance level. In some embodiments, if a core is drawing current from a power supply rail less than a total current that is allocated for that core (or for processor 804), then PCU 810*a*, PCU 810*b*, and/or PMIC 812 may temporarily increase the power draw for that core (or for processor 804), for example, by increasing a clock frequency and/or a power supply voltage level, so that the core or processor 804 can perform at a higher performance level. As such, in various embodiments, voltage and/or frequency may be increased temporarily for processor 804 without violating product reliability.

For some embodiments, PCU 810*a*, PCU 810*b*, and/or PMIC 812 may perform power management operations, e.g., based at least in part on receiving measurements from power measurement circuitries 842, temperature measurement circuitries 840, charge level of battery 818, and/or any other appropriate information that may be used for power management. To that end, PMIC 812 may be communicatively coupled to one or more sensors to sense and/or detect various values of and/or variations in one or more factors having an effect on power and/or thermal behavior of the system or platform. Examples of the one or more factors may include electrical current, voltage droop, temperature, operating frequency, operating voltage, power consumption, inter-core communication activity, and so on. Sensors for one or more of these factors may be provided in physical proximity to (and/or in thermal contact with or thermally coupled to) one or more components or logic/IP blocks of a computing system (e.g., a computing system of device 800). Additionally, in some embodiments, sensor(s) may be directly coupled to PCU 810*a*, PCU 810*b*, and/or PMIC 812 to allow PCU 810*a*, PCU 810*b*, and/or PMIC 812 to manage processor core energy at least in part based on value(s) detected by one or more of the sensors.

Also depicted is an example software stack of device 800 (although not all elements of the software stack are depicted). In various embodiments, processor 804 may execute application programs 850, Operating System (OS) 852, one or more Power Management (PM) specific application programs (e.g., generically referred to as PM applications 858), and/or the like. PM applications 858 may also be executed by PCU 810*a*, PCU 810*b*, and/or PMIC 812. OS 852 may also include one or more PM applications 856*a*, 856*b*, 856*c*, and so on. OS 852 may also include various drivers 854*a*, 854*b*, 854*c*, and so on, some of which may be specific for power management purposes. In some embodiments, device 800 may further comprise a Basic Input/ Output System (BIOS) 820. BIOS 820 may communicate with OS 852 (e.g., via one or more of drivers 854*a*, 854*b*, 854*c*, and so on), communicate with processor 804, and so on.

In various embodiments, one or more of PM applications 858, drivers that OS 852 includes (e.g., drivers 854*a*, 854*b*, 854*c*, and so on), PM applications that OS 852 includes (e.g., PM applications 856*a*, 856*b*, 856*c*, and so on), BIOS 820, and so on may be used to implement power management specific tasks. For example, these components may be used to control voltage and/or frequency of various components of device 800, to control wake-up state, sleep state, and/or any other appropriate power state of various components of device 800, to control battery power usage, to control a charging of the battery 818, to control features related to power saving operation, and so on.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 provides an apparatus comprising: a first circuitry with an oscillator; a first capacitor array with a set of first capacitors to tune the oscillator; a second capacitor array with a second capacitor to tune the oscillator, a capacitance of the second capacitor being greater than an average capacitance of the first capacitors; and a second circuitry operable to synchronously activate the second capacitor and deactivate a number N of the first capacitors, and to synchronously deactivate the second capacitor and activate the N first capacitors, based on a predetermined sequence.

In example 2, the apparatus of example 1, wherein the apparatus comprises an inductor-capacitor (LC) tank based Phase-Locked Loop (PLL) clock circuitry.

In example 3, the apparatus of any of examples 1 through 2, wherein the apparatus comprises a Delay-Locked Loop (DLL) clock circuitry.

In example 4, the apparatus of any of examples 1 through 3, wherein the oscillator comprises a Digital Controlled Oscillator (DCO).

In example 5, the apparatus of any of examples 1 through 4, wherein the predetermined sequence comprises one of: a delta-sigma modulation sequence, or a sigma-delta modulation sequence.

In example 6, the apparatus of any of examples 1 through 5, wherein the first capacitor array comprises a fine-tune capacitor array.

In example 7, the apparatus of example 6, wherein the second capacitor array comprises a coarse-tune capacitor array, and the second capacitor correspond with a least significant bit of the coarse-tune capacitor array.

In example 8, the apparatus of any of examples 6 through 7, comprising: a third capacitor array, wherein the third capacitor array comprises a coarse-tune capacitor array.

In example 9, the apparatus of any of examples 1 through 8, comprising: an additional circuitry operable to establish the number N.

In example 10, the apparatus of example 9, wherein an initial value of the number N is based on a ratio of the capacitance of the second capacitor to the average capacitance of the first capacitors.

In example 11, the apparatus of any of examples 1 through 10, comprising: an additional circuitry operable to provide one or more threshold values, wherein the second circuitry is operable to activate and deactivate the first capacitors and second capacitors based on the predetermined sequence when a number of the first capacitors that have been activated is outside of a range established by the one or more threshold values.

Example 12 provides an apparatus comprising: a first circuitry with a Digital Controlled Oscillator (DCO); a first capacitor array with a set of first capacitors to tune the DCO at a first level of granularity; a second capacitor array with a set of second capacitors to tune the DCO at a second level of granularity greater than the first level of granularity; and a second circuitry operable to synchronously activate the second capacitor and deactivate of a number N of the first capacitors, and to synchronously deactivate the second capacitor and activate the N first capacitors, based on a predetermined sequence.

In example 13, the apparatus of example 12, wherein the apparatus comprises one of: an inductor-capacitor (LC) tank based Phase-Locked Loop (PLL) clock circuitry; and a Delay-Locked Loop (DLL) clock circuitry.

In example 14, the apparatus of any of examples 12 through 13, wherein the predetermined sequence comprises one of: a delta-sigma modulation sequence, or a sigma-delta modulation sequence.

In example 15, the apparatus of any of examples 12 through 14, comprising an additional circuitry operable to establish the number N, wherein an initial value of the number N is based on a ratio of the capacitance of the second capacitor to the average capacitance of the first capacitors.

In example 16, the apparatus of any of examples 12 through 15, comprising an additional circuitry operable to provide one or more threshold values, wherein the second circuitry is operable to activate and deactivate the first capacitors and second capacitors based on the predetermined sequence when a number of the first capacitors that have been activated is outside of a range established by the one or more threshold values.

Example 17 provides a system comprising a memory, a processor coupled to the memory, and a wireless interface for allowing the processor to communicate with another device, the processor including: a first circuitry with a Digital Controlled Oscillator (DCO); a first capacitor array with a set of first capacitors to tune the DCO; a second capacitor array with a second capacitor to tune the DCO, a capacitance of the second capacitor being greater than an average capacitance of the first capacitors; and a second circuitry operable to synchronously activate the second capacitor and deactivate a number N of the first capacitors, and to synchronously deactivate the second capacitor and activate the N first capacitors, based on a predetermined sequence, wherein the first capacitor array comprises a fine-tune capacitor array.

In example 18, the system of example 17, comprising: a third capacitor array, wherein the third capacitor array comprises a coarse-tune capacitor array; wherein the apparatus comprises one of: an inductor-capacitor (LC) tank based Phase-Locked Loop (PLL) clock circuitry; and a Delay-Locked Loop (DLL) clock circuitry; and wherein the predetermined sequence comprises one of: a delta-sigma modulation sequence, or a sigma-delta modulation sequence.

In example 19, the system of any of examples 17 through 18, comprising: an additional circuitry operable to establish the number N, wherein an initial value of the number N is based on a ratio of the capacitance of the second capacitor to the average capacitance of the first capacitors.

In example 20, the system of any of examples 17 through 19, comprising: an additional circuitry operable to provide one or more threshold values, wherein the second circuitry is operable to activate and deactivate the first capacitors and second capacitors based on the predetermined sequence when a number of the first capacitors that have been activated is outside of a range established by the one or more threshold values.

Example 21 provides a method comprising: providing a first circuitry with an oscillator; providing a first capacitor array with a set of first capacitors to tune the oscillator; providing a second capacitor array with a second capacitor to tune the oscillator, a capacitance of the second capacitor being greater than an average capacitance of the first capacitors; and performing a predetermined sequence of activating the second capacitor while deactivating a number N of the first capacitors, and deactivating the second capacitor while activating the N first capacitors.

In example 22, the method of example 21, wherein the apparatus comprises one of: an inductor-capacitor (LC) tank based Phase-Locked Loop (PLL) clock circuitry; and a Delay-Locked Loop (DLL) clock circuitry.

In example 23, the method of any of examples 21 through 22, wherein the oscillator comprises a Digital Controlled Oscillator (DCO); wherein the predetermined sequence comprises one of: a delta-sigma modulation sequence, or a sigma-delta modulation sequence; and wherein the first capacitor array comprises a fine-tune capacitor array.

In example 24, the method of example 23, wherein the second capacitor array comprises a coarse-tune capacitor array, and the second capacitor corresponds with a least significant bit of the coarse-tune capacitor array.

In example 25, the method of any of examples 23 through 24, comprising: providing a third capacitor array, wherein the third capacitor array comprises a coarse-tune capacitor array.

In example 26, the method of any of examples 21 through 25, comprising: providing a third circuitry operable to establish the number N, wherein an initial value of the number N is based on a ratio of the capacitance of the second capacitor to the average capacitance of the first capacitors.

In example 27, the method of any of examples 21 through 26, comprising: providing a fourth circuitry operable to provide one or more threshold values, wherein the second circuitry is operable to activate and deactivate the first capacitors and second capacitors based on the predetermined sequence when a number of the first capacitors that have been activated is outside of a range established by the one or more threshold values.

Example 28 provides an apparatus comprising: a first circuitry having a plurality of first data inputs coupled respectively to a plurality of Automatic Frequency Select (AFS) thermometer code bits, a plurality of second data inputs coupled to a ramp signal, a plurality of selection inputs coupled respectively to a plurality of ramp selection bits, and a plurality of outputs coupled respectively to a plurality of control signal bits; a second circuitry having a plurality of data inputs coupled respectively to the plurality of AFS thermometer code bits, a plurality of data outputs coupled respectively to a plurality of latched AFS thermometer code bits, and a plurality of enable inputs coupled to a ramp enable bit; and a plurality of third circuities to respectively establish values for the plurality of ramp selection bits based on the respective latched AFS thermometer code bits and logically adjacent latched AFS thermometer code bits.

In example 29, the apparatus of example 28, wherein the first circuitry selects the second data inputs when the respective ramp selection bits have a first value that corresponds with the respective AFS thermometer code bits being currently ramped; and wherein the first circuitry selects the first data inputs when the respective ramp selection bits have a second value that corresponds with the respective AFS thermometer code bits not currently being ramped.

In example 30, the apparatus of any of examples 28 through 29, wherein the second circuitry comprises a respective plurality of D-latches.

In example 31, the apparatus of any of examples 28 through 30, wherein, in an AFS step-down, the third circuitry respectively establishes the plurality of ramp selection bits based on the respective latched AFS thermometer code bits being asserted and respective next-lower latched AFS thermometer code bits being deasserted.

In example 32, the apparatus of any of examples 28 through 31, wherein, in an AFS step-up, the third circuitry respectively establishes the plurality of ramp selection bits based on the respective latched AFS thermometer code bits being deasserted and respective next-higher latched AFS thermometer code bits being asserted.

Example 33 provides an apparatus comprising: a plurality of first circuitries having first data inputs coupled respectively to a plurality of Automatic Frequency Select (AFS) thermometer code bits, second data inputs coupled to a ramp signal, selection inputs coupled respectively to a plurality of ramp selection bits, and outputs coupled respectively to a plurality of control signal bits; a plurality of second circuitries having data inputs coupled respectively to the plurality of AFS thermometer code bits, data output coupled respectively to a plurality of latched AFS thermometer code bits, and a plurality of enable inputs coupled to a ramp enable bit; and a plurality of third circuities to respectively establish values for the plurality of ramp selection bits based on the respective latched AFS thermometer code bits and logically adjacent latched AFS thermometer code bits, wherein the second circuitries comprise a respective plurality of D-latches.

In example 34, the apparatus of example 33, wherein the first circuitries select the second data inputs when the respective ramp selection bits have a first value that corresponds with the respective AFS thermometer code bits being currently ramped; and wherein the first circuitries select the first data inputs when the respective ramp selection bits have a second value that corresponds with the respective AFS thermometer code bits not currently being ramped.

In example 35, the apparatus of any of examples 33 through 34, wherein, in an AFS step-down, the third circuitries respectively establish the plurality of ramp selection bits based on the respective latched AFS thermometer code bits being asserted and respective next-lower latched AFS thermometer code bits being deasserted.

In example 36, the apparatus of any of examples 33 through 35, wherein, in an AFS step-up, the third circuitries respectively establish the plurality of ramp selection bits based on the respective latched AFS thermometer code bits being deasserted and respective next-higher latched AFS thermometer code bits being asserted.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first circuitry with an oscillator;
a first capacitor array including a set of first capacitors to tune the oscillator;
a second capacitor array including a second capacitor to tune the oscillator, a capacitance of the second capacitor being greater than an average capacitance of the set of first capacitors;
a second circuitry operable to synchronously activate the second capacitor and deactivate a number N of the first capacitors of the set, and to synchronously deactivate the second capacitor and activate the N first capacitors of the set, based on a predetermined sequence; and
a third circuitry operable to establish the number N, wherein an initial value of the number N is based on a ratio of the capacitance of the second capacitor to the average capacitance of the set of first capacitors.

2. The apparatus of claim 1,
wherein the apparatus comprises an inductor-capacitor (LC) tank-based Phase-Locked Loop (PLL) clock circuitry.

3. The apparatus of claim 1,
comprises a Delay-Locked Loop (DLL) clock circuitry.

4. The apparatus of claim 1,
wherein the oscillator comprises a Digital Controlled Oscillator (DCO).

5. The apparatus of claim 1,
wherein the predetermined sequence comprises one of: a delta-sigma modulation sequence, or a sigma-delta modulation sequence.

6. The apparatus of claim 1,
wherein the first capacitor array comprises a fine-tune capacitor array.

7. The apparatus of claim 6,
wherein the second capacitor array comprises a coarse-tune capacitor array, and one of a capacitor of the second capacitor array correspond with a least significant bit of the coarse-tune capacitor array.

8. The apparatus of claim 6, comprising:
a third capacitor array,
wherein the third capacitor array comprises a coarse-tune capacitor array.

9. The apparatus of claim 1, comprising:
a fourth circuitry operable to provide one or more threshold values,
wherein the second circuitry is operable to activate and deactivate the set of first capacitors and second capacitor based on the predetermined sequence when a number of the set of first capacitors of the set that have been activated is outside of a range established by the one or more threshold values.

10. An apparatus comprising:
a first circuitry with a Digital Controlled Oscillator (DCO);
a first capacitor array with a set of first capacitors to tune the DCO at a first level of granularity;
a second capacitor array with a set of second capacitors to tune the DCO at a second level of granularity greater than the first level of granularity;
a second circuitry operable to synchronously activate the set of second capacitors and deactivate of a number N of the set of first capacitors, and to synchronously deactivate the second capacitors and activate the N first capacitors, based on a predetermined sequence; and
a third circuitry operable to establish the number N, wherein an initial value of the number N is based on a ratio of a capacitance of the set of second capacitors to an average capacitance of the set of first capacitors.

11. The apparatus of claim 10,
comprises one of: an inductor-capacitor (LC) tank-based Phase-Locked Loop (PLL) clock circuitry; or a Delay-Locked Loop (DLL) clock circuitry.

12. The apparatus of claim 10,
wherein the predetermined sequence comprises one of: a delta-sigma modulation sequence, or a sigma-delta modulation sequence.

13. The apparatus of claim 10,
comprising a fourth circuitry operable to provide one or more threshold values,
wherein the second circuitry is operable to activate and deactivate the set of first capacitors and the set of second capacitors based on the predetermined sequence when a number of the set of first capacitors that have been activated is outside of a range established by the one or more threshold values.

14. A system comprising a memory, a processor coupled to the memory, and a wireless interface to allow the processor to communicate with another device, the processor including:
a first circuitry with a Digital Controlled Oscillator (DCO);
a first capacitor array with a set of first capacitors to tune the DCO;
a second capacitor array with a second capacitor to tune the DCO, a capacitance of the second capacitor being greater than an average capacitance of the first capacitors of the set;
a second circuitry operable to synchronously activate the second capacitor and deactivate a number N of the first capacitors of the set, and to synchronously deactivate the second capacitor and activate the N first capacitors, based on a predetermined sequence; and
a third circuitry operable to establish the number N, wherein an initial value of the number N is based on a ratio of the capacitance of the second capacitors to the average capacitance of the set of first capacitors.

15. The system of claim 14, comprising:
a third capacitor array,
wherein the third capacitor array comprises a coarse-tune capacitor array.

16. The system of claim 14, wherein the processor comprising:
a fourth circuitry operable to provide one or more threshold values,
wherein the second circuitry is operable to activate and deactivate the set of first capacitors of the set and the second capacitor based on the predetermined sequence when a number of the set of first capacitors that have been activated is outside of a range established by the one or more threshold values.

17. The system of claim 14,
wherein the first capacitor array comprises a fine-tune capacitor array.

18. The system of claim 14,
wherein the second capacitor array comprises a coarse-tune capacitor array, and one of a capacitor of the second capacitor array correspond with a least significant bit of the coarse-tune capacitor array.

19. The system of claim 14, wherein the predetermined sequence comprises one of: a delta-sigma modulation sequence, or a sigma-delta modulation sequence.

20. They system of claim 14, wherein the processor comprises one of: an inductor-capacitor (LC) tank-based Phase-Locked Loop (PLL) clock circuitry; or a Delay-Locked Loop (DLL) clock circuitry.

* * * * *